United States Patent
Jo et al.

(10) Patent No.: US 12,416,072 B2
(45) Date of Patent: Sep. 16, 2025

(54) MASK MANUFACTURING EQUIPMENT AND METHOD OF MANUFACTURING MASK USING THE SAME

(71) Applicant: Samsung Display Co., LTD., Yongin-si (KR)

(72) Inventors: Junho Jo, Seoul (KR); Seungwon Kim, Seoul (KR); Youngho Park, Suwon-si (KR); Seungyong Song, Suwon-si (KR); Youngchul Lee, Cheonan-si (KR); Sungsoon Im, Suwon-si (KR); Youngsuck Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 792 days.

(21) Appl. No.: 17/197,701

(22) Filed: Mar. 10, 2021

(65) Prior Publication Data
US 2021/0379694 A1    Dec. 9, 2021

(30) Foreign Application Priority Data
Jun. 3, 2020    (KR) .................. 10-2020-0067132

(51) Int. Cl.
*B23K 26/03*    (2006.01)
*B23K 26/00*    (2014.01)
(Continued)

(52) U.S. Cl.
CPC ........ *C23C 14/042* (2013.01); *B23K 26/0093* (2013.01); *B23K 26/032* (2013.01);
(Continued)

(58) Field of Classification Search
CPC .. B23K 26/032; B23K 26/0093; B23K 28/02; H10K 71/00; H10K 71/40; H10K 71/421; H10K 71/441
See application file for complete search history.

(56) References Cited

U.S. PATENT DOCUMENTS 9,847,485 B2    12/2017 Min
2015/0001196 A1*    1/2015 Kim ................. B23K 31/125
                                                          219/121.83
(Continued)

FOREIGN PATENT DOCUMENTS

KR    10-0705316    4/2007
KR    101463935    * 12/2014
(Continued)

OTHER PUBLICATIONS

KR20200009799 machine translation (Year: 2020).*
KR 101463935 machine translation (Year: 2014).*

*Primary Examiner* — Alison L Hindenlang
*Assistant Examiner* — Alexander A Wang

(57) ABSTRACT

A mask manufacturing equipment includes a first stage on which a mask frame is disposed, the mask frame including cell openings arranged in a first direction and a second direction intersecting the first direction, a transfer module that places cell masks on the mask frame to respectively overlap the cell openings of the mask frame and the cell masks, a camera module that photographs the cell masks, a first processing module that irradiates a first laser beam between a border portion corresponding to a portion of the mask frame adjacent to an N-th cell opening and a first edge area of an N-th cell mask disposed on the border portion, and a second processing module that irradiates a second laser beam to a boundary area between the first edge area and a second edge area extending from the first edge area.

15 Claims, 23 Drawing Sheets

(51) Int. Cl.
　　　*B23K 26/06*　　　(2014.01)
　　　*B23K 26/08*　　　(2014.01)
　　　*B23K 26/362*　　(2014.01)
　　　*B23K 26/40*　　　(2014.01)
　　　*C23C 14/04*　　　(2006.01)
　　　*H10K 71/00*　　　(2023.01)

(52) U.S. Cl.
　　　CPC ...... *B23K 26/0604* (2013.01); *B23K 26/0876* (2013.01); *B23K 26/362* (2013.01); *B23K 26/40* (2013.01); *H10K 71/00* (2023.02)

(56) References Cited

U.S. PATENT DOCUMENTS

| | | |
|---|---|---|
| 2017/0045877 A1* | 2/2017 | Shapiro ............... B23K 26/032 |
| 2021/0217956 A1 | 7/2021 | Im et al. |
| 2021/0217997 A1 | 7/2021 | Kwag et al. |
| 2023/0125552 A1* | 4/2023 | Min ..................... H01L 21/683 |
| | | 156/751 |

FOREIGN PATENT DOCUMENTS

| | | |
|---|---|---|
| KR | 10-2017-0056769 | 5/2017 |
| KR | 10-1795322 | 11/2017 |
| KR | 10-2011723 | 8/2019 |
| KR | 10-2019-0138256 | 12/2019 |
| KR | 10-2020-0000775 | 1/2020 |
| KR | 10-2020-0009799 | 1/2020 |
| KR | 10-2021-0091382 | 7/2021 |
| KR | 10-2021-0091383 | 7/2021 |
| KR | 10-2021-0113526 | 9/2021 |

\* cited by examiner

MASK MANUFACTURING EQUIPMENT AND METHOD OF MANUFACTURING MASK USING THE SAME

CROSS-REFERENCE TO RELATED APPLICATION(S)

This application claims priority to and benefits of Korean Patent Application No. 10-2020-0067132 under 35 U.S.C. § 119, filed on Jun. 3, 2020 in the Korean Intellectual Property Office, the entire contents of which are incorporated herein by reference.

BACKGROUND

1. Technical Field

The disclosure relates to a mask manufacturing equipment and a method of manufacturing a mask using the mask manufacturing equipment.

2. Description of the Related Art

A display panel may include a plurality of pixels. Each of the pixels may include a driving element, such as a transistor, and a display element, such as an organic light emitting diode. The display element may be formed by stacking an electrode and a light emission pattern on a substrate. The light emission pattern may be patterned using a mask through which holes may be defined, and thus, the light emission pattern may be formed in predetermined areas. The light emission pattern may be formed in areas exposed through the holes.

In recent years, technologies for a manufacturing equipment and a manufacturing method for a large-area mask are being developed to increase a production yield of the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask manufacturing equipment capable of mounting a mask on a mask frame in a cell unit to manufacture a large-area mask.

The disclosure provides a method of manufacturing the mask using the mask manufacturing equipment.

Embodiments provide a mask manufacturing equipment that may include a first stage on which a mask frame is disposed, the mask frame including a plurality of cell openings arranged in a first direction and a second direction intersecting the first direction; a transfer module that places a plurality of cell masks on the mask frame to respectively overlap the plurality of cell openings of the mask frame and the plurality of cell masks; a camera module that photographs the plurality of cell masks; a first processing module that irradiates a first laser beam between a border portion corresponding to a portion of the mask frame adjacent to an N-th cell opening and a first edge area of an N-th cell mask disposed on the border portion; and a second processing module that irradiates a second laser beam to a boundary area between the first edge area of the N-th cell mask and a second edge area of the N-th cell mask extending from the first edge area. N is a natural number.

The transfer module may include a head assembly including a head frame and at least one tool disposed on a lower surface of the head frame; and a transfer driver transferring the head assembly in the first direction, the second direction, or a third direction substantially perpendicular to a plane defined by the first direction and the second direction.

The at least one tool may include a plurality of tools, and the plurality of tools may be spaced apart from each other and disposed around an opening of the head frame.

The head assembly may include a tensioning driver disposed between the head frame and the plurality of tools, and the tensioning driver may move the plurality of tools in a direction substantially parallel to an upper surface of the N-th cell mask and tension the N-th cell mask when the plurality of tools adsorb the N-th cell mask.

The plurality of tools each may include a lower surface, and each lower surface of the plurality of tools may adsorb an upper surface of the first edge area or the second edge area of the N-th cell mask.

The plurality of tools may adsorb the plurality of cell masks using one of an electromagnetic force, an electrostatic force, and a vacuum suction power.

The plurality of tools may include a contact surface inclined at an angle with respect to a plane defined by the first direction and the second direction.

The first processing module may include a first laser irradiator irradiating the first laser beam; and a first laser driver connected to the first laser irradiator to move the first laser irradiator in the first direction, the second direction, or a third direction substantially perpendicular to a plane defined by the first direction and the second direction.

The first processing module may be disposed in an opening of the first stage.

The first laser beam may melt a portion of the first edge area of the N-th cell mask and a portion of the border portion of the mask frame to fix the N-th cell mask to the mask frame.

The second processing module may include a second laser irradiator that irradiates the second laser beam, and the second laser beam may remove the second edge area from the N-th cell mask.

The camera module may include a base plate; and a plurality of cameras disposed on a lower surface of the base plate.

Each of the plurality of cameras may include a telecentric lens.

The mask manufacturing equipment may further include a second stage on which the N-th cell mask may be disposed; and a tension module including a plurality of clamps disposed around the second stage and tensioning the N-th cell mask in a direction substantially parallel to an upper surface of the N-th cell mask.

Embodiments provide a method of manufacturing a mask. The method may include disposing a mask frame on a stage, the mask frame including a plurality of cell openings arranged in a first direction and a second direction intersecting the first direction; disposing a first edge area of an N-th cell mask on a border portion of the mask frame corresponding to a portion of the mask frame adjacent to an N-th cell opening; photographing the N-th cell mask; irradiating a first laser beam between the border portion of the mask frame and the first edge area of the N-th cell mask; and irradiating a second laser beam between the first edge area of the N-th cell mask and a second edge area of the N-th cell mask extending from the first edge area. N is a natural number.

The first edge area of the N-th cell mask may have a substantially quadrangular ring shape in a plan view, and the first laser beam may be irradiated along the first edge area of the N-th cell mask and the border portion of the mask frame contacting the first edge area of the N-th cell mask.

The second laser beam may be irradiated between the first edge area of the N-th cell mask and the second edge area of the N-th cell mask to remove the second edge area from the N-th cell mask.

The disposing of the first edge area of the N-th cell mask may be performed by a transfer module including at least one tool including a contact surface inclined at an angle with respect to a plane defined by the first direction and the second direction, and the at least one tool may adsorb the first edge area or the second edge area of the N-th cell mask using one of an electromagnetic force, an electrostatic force, and a vacuum suction force.

The photographing of the N-th cell mask may be performed by a camera module including a plurality of cameras spaced apart from the stage, and each of the plurality of cameras may photograph a plurality of marks formed in the N-th cell mask when the N-th cell mask is viewed from the plurality of cameras.

The method may further include tensioning the N-th cell mask before the disposing of the first edge of the N-th cell mask.

Embodiments provide a mask manufacturing equipment that may include a stage on which a mask frame is disposed, the mask frame including a cell opening; a transfer module that places a cell mask on the mask frame to overlap the cell opening and the cell mask; a camera module that photographs the cell mask; a first processing module that irradiates a first laser beam between a border corresponding to a portion of the mask frame adjacent the cell opening and a first edge area of the cell mask disposed on the border portion; and a second processing module that irradiates a second laser beam to a boundary area between the first edge area of the cell mask and a second edge area of the cell mask extending from the first edge area. The first laser beam may be irradiated between the border portion of the mask frame and the first edge area of the cell mask to form a single closed curve along the border portion of the mask frame.

According to the above, the mask manufacturing equipment may include the transfer module placing the cell mask on the mask frame, the first processing module fixing the cell mask to the mask frame, and the second processing module processing the edge area of the cell mask, and thus, the large-area mask may be easily manufactured.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
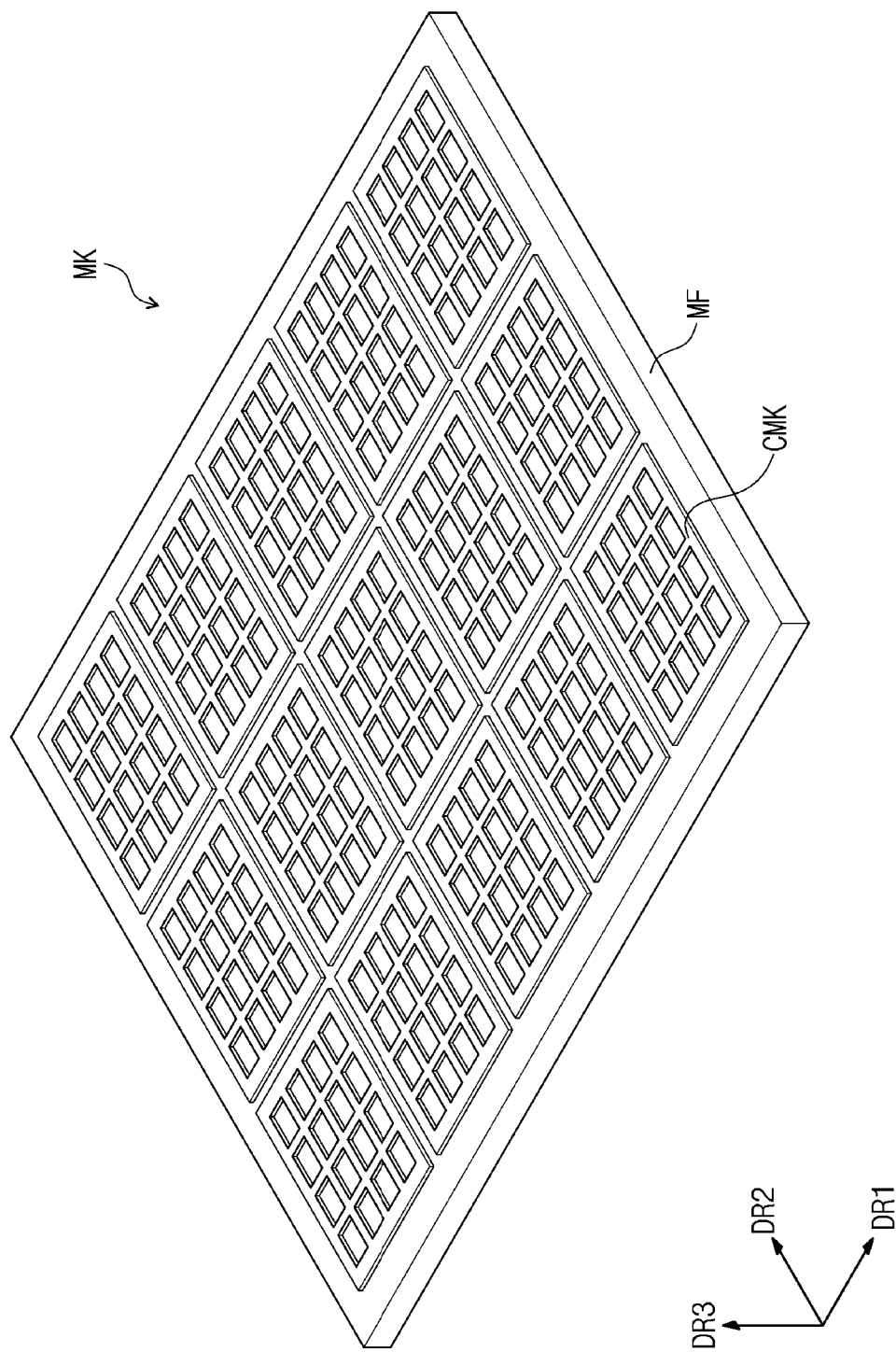
FIGS. 1 and 2 are perspective views showing a mask manufactured by a mask manufacturing equipment according to an embodiment.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content and for clarity.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures but is not limited thereto.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising", "includes" and/or "including", "has or have" and/or "having" and their variations when used in this specification, specify the presence of stated features, integers, steps, operations, elements, and/or components, but do not preclude the presence or addition of one or more other features, integers, steps, operations, elements, components, and/or groups thereof.

Hereinafter, the disclosure will be explained in detail with reference to the accompanying drawings.

Figure 2:
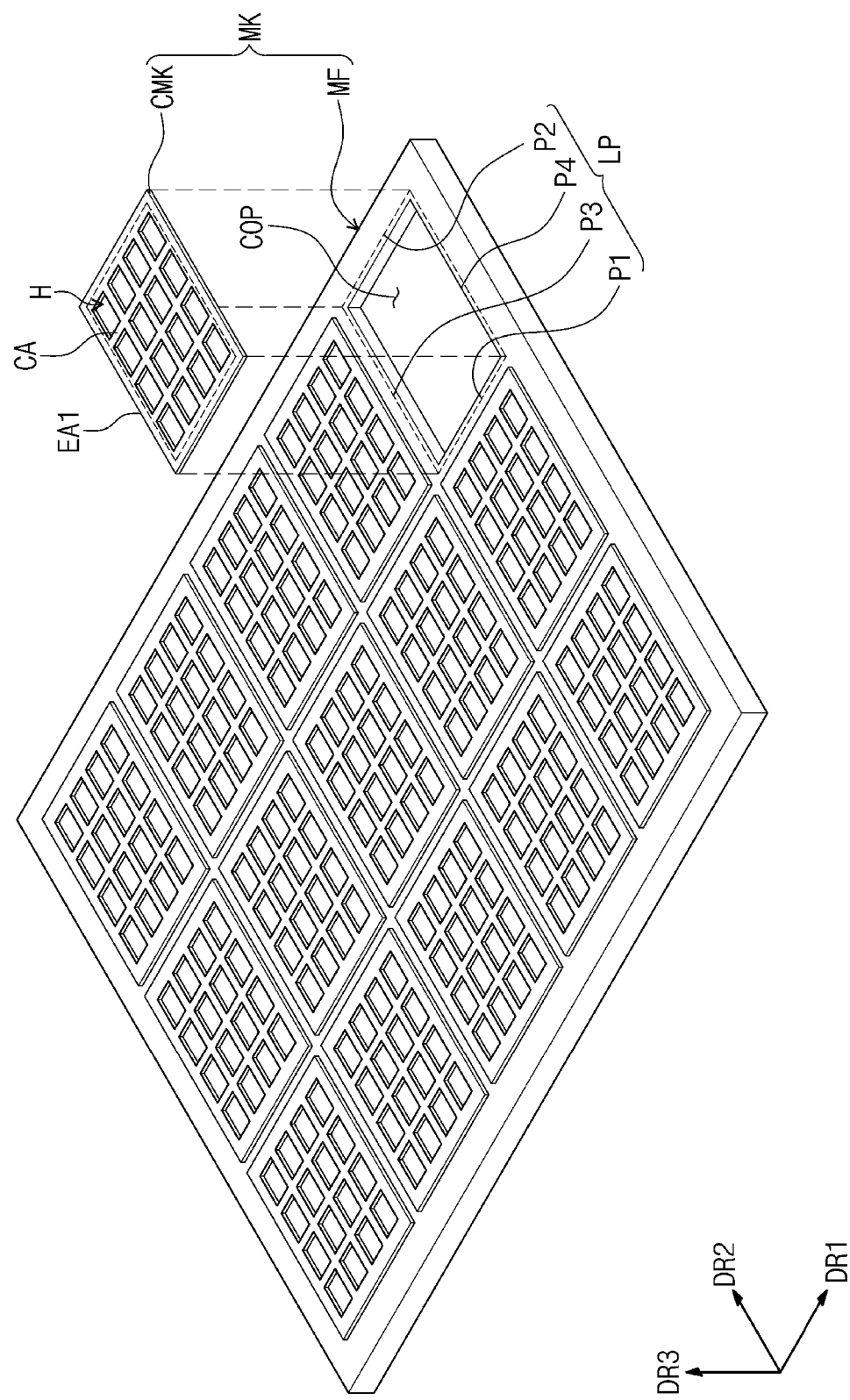

FIGS. 1 and 2 are perspective views showing a mask MK manufactured by a mask manufacturing equipment according to an embodiment. For the convenience of explanation, FIG. 2 shows one cell mask CMK separated from a mask frame MF.

Referring to FIGS. 1 and 2, the mask MK may be used for a manufacturing process of a display device. In detail, the mask MK may be used for a process of depositing an organic light emitting element layer on a deposition substrate of the display device.

The mask MK may have a substantially cuboid shape. For example, the mask MK may include two long sides extending in a first direction DR1 and two short sides extending in a second direction DR2 but is not limited thereto. For example, the mask MK may include two short sides extending in a first direction DR1 and two long sides extending in a second direction DR2. The second direction DR2 indicates a direction crossing or intersecting the first direction DR1.

The mask MK may be a plate with a thin thickness in a third direction DR3. The third direction DR3 may indicate a direction substantially vertically crossing or intersecting a plane defined by the first direction DR1 and the second direction DR2. Hereinafter, in the disclosure, the expression "when viewed in a plan view" may mean a state of being viewed in the third direction DR3.

The mask MK may include the mask frame MF and a plurality of cell masks CMK. The mask frame MF and the cell masks CMK may include a metal material, such as a stainless steel (SUS), an Invar alloy, nickel (Ni), or cobalt (Co). However, the material for the mask frame MF and the cell masks CMK should not be limited thereto or thereby. For instance, the mask frame MF and the cell masks CMK may include a polyimide-based material to reduce weight of members.

The mask frame MF may have a substantially quadrangular shape defined by long sides extending in the first direction DR1 and short sides extending in the second direction DR2. A plurality of cell openings COP may be included or defined through the mask frame MF. The cell openings COP may be arranged or disposed in the first direction DR1 and the second direction DR2.

When viewed in a plan view, each of the cell openings COP may have a substantially quadrangular shape. For example, each cell opening COP may be formed or defined by two long sides extending in the second direction DR2 and two short sides extending in the first direction DR1. The cell openings COP may be included in or defined through the mask frame MF in the third direction DR3.

FIGS. 1 and 2 show fifteen cell openings COP, however, this is merely an example. The number of the cell openings COP may be more or less than fifteen. For example, the shape of each cell opening COP may be changed to substantially correspond to a shape of the cell mask CMK described below.

A border portion LP may correspond to a portion of the mask frame MF around each cell opening COP. When viewed in a plan view, the border portion LP may have a substantially quadrangular ring shape.

When viewed in a plan view, the cell masks CMK may overlap corresponding cell openings COP, respectively.

When viewed in a plan view, each of the cell masks CMK may have a substantially quadrangular shape.

Each of the cell masks CMK may include a center area CA and a first edge area EA1. A plurality of holes H may be formed or defined in the center area CA. The holes H may be formed or defined through the cell masks CMK in the third direction DR3. The holes H may have a width that may be variable. For example, a width of an upper portion of the hole H may be greater than a width of a lower portion of the hole H in the third direction DR3. However, the shape of the hole H should not be limited thereto or thereby. The first edge area EA1 may extend in the first direction DR1 and the second direction DR2 from the center area CA. When viewed in a plan view, the first edge area EA1 may have a substantially quadrangular ring shape.

The cell masks CMK may be disposed on the mask frame MF. For example, an N-th cell mask CMK may be disposed on an N-th cell opening COP. "N" is a natural number.

When viewed in a plan view, a size of the center area CA of the cell mask CMK may be substantially the same as that of the cell opening COP. The first edge area EA1 of the cell mask CMK may be disposed on the border portion LP.

The cell masks CMK may be fixed to the mask frame MF. For instance, the first edge area EA1 of the cell mask CMK may be fixed to a corresponding border portion LP. For example, a soldering process may be performed between first, second, third, and fourth portions P1, P2, P3, and P4 of the border portion LP and portions of a corresponding first edge area EA1 of the cell mask CMK. This will be described later.

Figure 3:
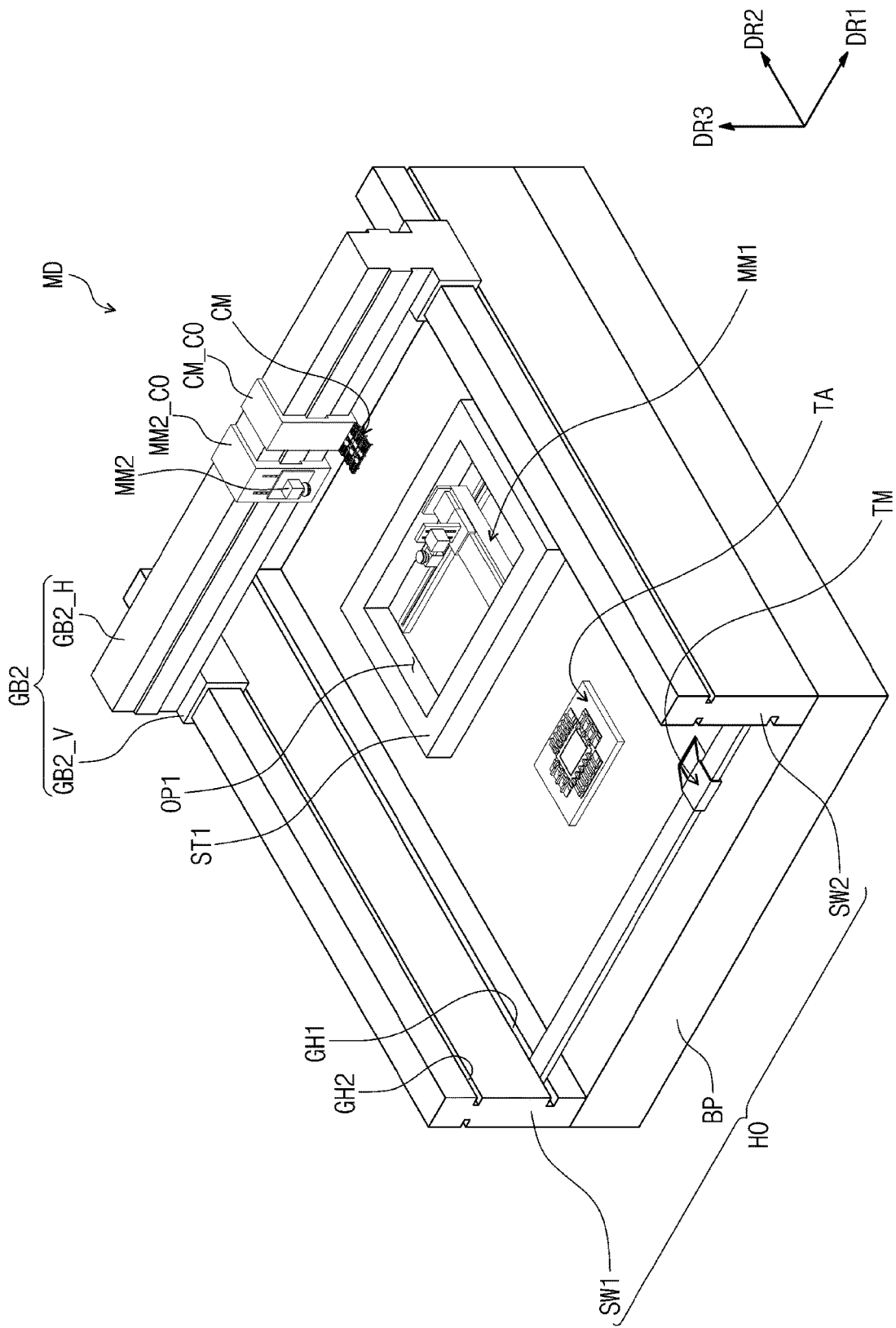
FIG. 3 is a perspective view showing a mask manufacturing equipment according to an embodiment.

FIG. 3 is a perspective view showing a mask manufacturing equipment MD according to an embodiment.

Referring to FIG. 3, the mask manufacturing equipment MD may be used to manufacture the mask MK (refer to FIG. 1). In detail, the mask manufacturing equipment MD may fix the cell masks CMK to the mask frame MK (refer to FIG. 1).

According to an embodiment, the mask manufacturing equipment MD may include a housing HO, a first stage ST1, a transfer module TM, a camera module CM, a first processing module MM1, and a second processing module MM2.

The housing HO may provide an overall appearance of the mask manufacturing equipment MD. The first stage ST1, the transfer module TM, the camera module CM, the first processing module MM1, and the second processing module MM2 may be mounted on the housing HO.

The housing HO may include a lower plate BP, a first sidewall SW1, and a second sidewall SW2. Each of the first sidewall SW1 and the second sidewall SW2 may extend in the second direction DR2. The first sidewall SW1 and the second sidewall SW2 may extend from a upper surface of the lower plate BP in the third direction DR3. The first sidewall SW1 and the second sidewall SW2 may face each other in the first direction DR1.

A first guide groove GH1 may be formed or defined in each of the first sidewall SW1 and the second sidewall SW2. As shown in FIG. 3, the first guide groove GH1 may be formed or defined in an inner surface of the first sidewall SW1. The first guide groove GH1 may extend in the second direction DR2. Although not visible in FIG. 3, the first guide groove GH1 may be formed or defined in an inner surface of the second sidewall SW2.

A second guide groove GH2 may be formed or defined in each of the first sidewall SW1 and the second sidewall SW2. The second guide groove GH2 may be formed or defined at a position higher than that of the first guide groove GH1 in the third direction DR3. The second guide groove GH2 may extend in the second direction DR2.

The first stage ST1 may be disposed on the lower plate BP. When viewed in a plan view, the first stage ST1 may have a substantially quadrangular ring shape. The mask frame MF (refer to FIG. 1) may be disposed on the first stage ST1.

A first opening OP1 may be defined through a center portion of the first stage ST1. The first opening OP1 may be formed through the first stage ST1 in the third direction DR3.

Figure 4:
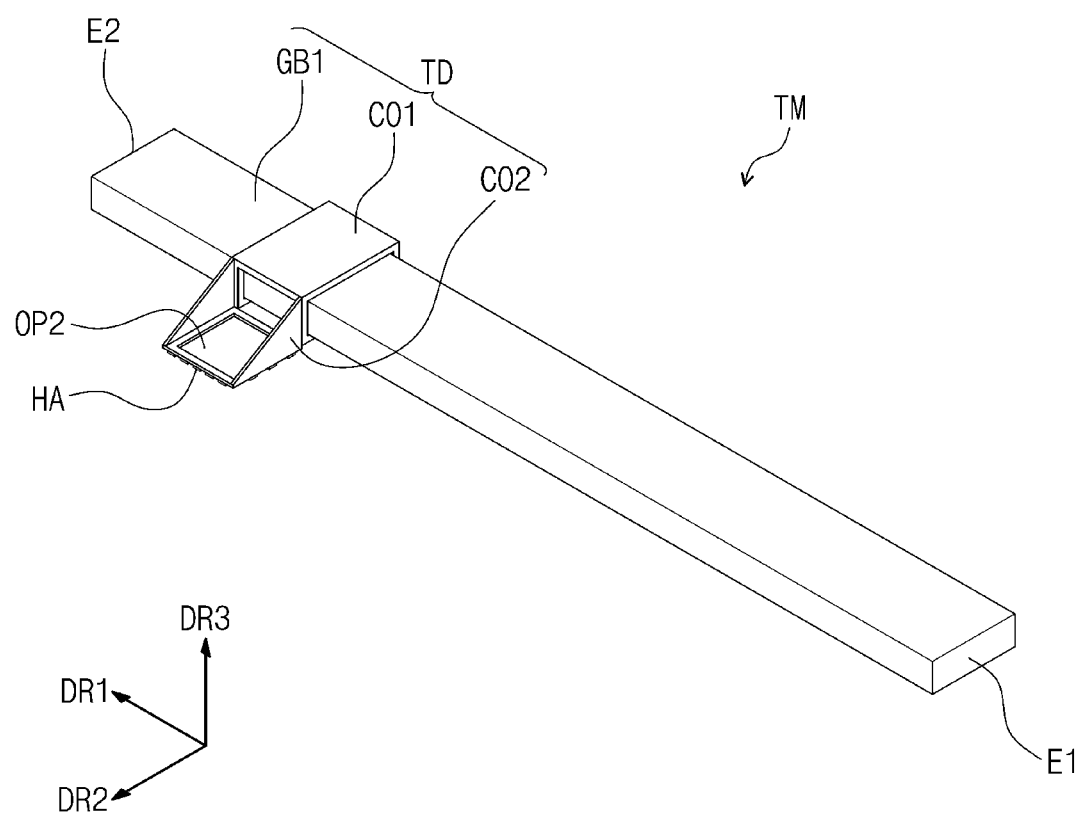
FIG. 4 is a perspective view showing a transfer module shown in FIG. 3.
Figure 5:
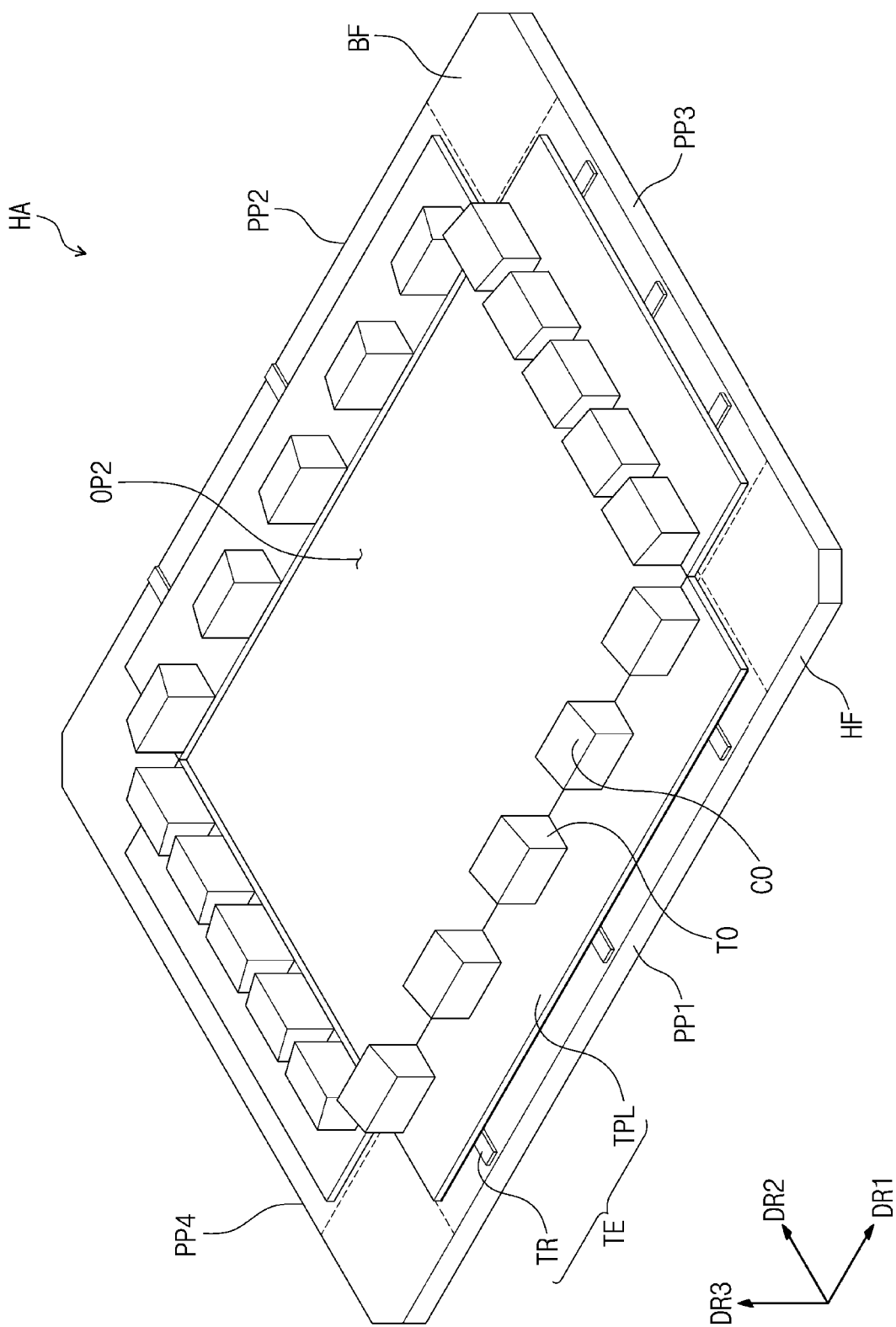
FIG. 5 is a perspective view showing a head assembly of the transfer module shown in FIG. 4.

FIG. 4 is a perspective view showing the transfer module TM shown in FIG. 3. FIG. 5 is a perspective view showing a head assembly HA of the transfer module TM shown in FIG. 4. For the convenience of explanation, FIG. 5 shows the head assembly HA upside down.

Referring to FIGS. 3 to 5, the transfer module TM may pick the cell mask CMK shown in FIG. 1. The transfer module TM may place the cell mask CMK on the mask frame MF shown in FIG. 1.

According to an embodiment, the transfer module TM may include the head assembly HA and a transfer driver TD. The head assembly HA of the transfer module TM may pick the cell mask CMK.

The head assembly HA may include a head frame HF and one or more tools TO (refer to FIGS. 3 to 5). A second opening OP2 may be formed or defined through a center portion of the head frame HF. When viewed in a plan view, the second opening OP2 may have a substantially quadrangular shape. The second opening OP2 may be formed or defined through the head frame HF in the third direction DR3.

When viewed in a plan view, the head frame HF may have a substantially quadrangular ring shape. In detail, the head frame HF may include a first portion PP1, a second portion PP2, a third portion PP3, and a fourth portion PP4. Each of the first portion PP1 and the second portion PP2 may extend in the first direction DR1. The first portion PP1 and the second portion PP2 may face each other in the second direction DR2. Each of the third portion PP3 and the fourth portion PP4 may extend in the second direction DR2. The third portion PP3 and the fourth portion PP4 may face each other in the first direction DR1.

The tool TO may be disposed on a bottom surface BF of the head frame HF. In an embodiment, the tool TO may be provided in plural. In detail, the tools TO may be disposed on the bottom surfaces BF of the first to fourth portions PP1 to PP4. As an example, five tools TO may be disposed on each of the first to fourth portions PP1 to PP4. However, the number of the tools TO disposed on the bottom surface BF of the head frame HF should not be limited thereto or thereby. For example, one or a tool that extends in a longitudinal direction corresponding to an extension direction of the first to fourth portions PP1 to PP4 may be disposed on each of the first to fourth portions PP1 to PP4.

The tools TO may be arranged or disposed to be spaced apart from each other. In detail, the tools TO disposed on the first and second portions PP1 and PP2 may be spaced apart from each other in the first direction DR1. The tools TO disposed on the third and fourth portions PP3 and PP4 may be spaced apart from each other in the second direction DR2.

According to an embodiment, each of the tools TO may include a contact surface CO. The contact surface CO may be an inclined surface. For example, the contact surface CO may be inclined at a predetermined angle with respect to a plane defined by the first direction DR1 and the second direction DR2. A height in the third direction DR3 of the contact surface CO may be lowered from an inside to an outside of the tool TO. In this case, the inside means a portion of the contact surface CO, which may be adjacent to the second opening OP2.

The tools TO may be in contact with an upper surface of the cell mask CMK shown in FIG. 1. In a case that the tools TO are in contact with the upper surface of the cell mask CMK, the upper surface of the cell mask CMK may be adsorbed by the tools TO. For example, the upper surface of the cell mask CMK may be adsorbed by the tools TO using one of an electromagnetic force, an electrostatic force, or a vacuum suction force.

Since the contact surface CO of the tools TO is the inclined surface, portions of the cell masks CMK adsorbed by the tools TO may be inclined at a predetermined angle with respect to a plane defined by the first direction DR1 and the second direction DR2. This will be described in detail later.

According to an embodiment, the head assembly HA may include a tensioning driver TE disposed between the head frame HF and the tools TO. The tensioning driver TE may move the cell mask CMK in a direction substantially parallel to the upper surface of the cell mask CMK.

In detail, the tensioning driver TE may include a tool plate TPL and a tool rail TR. The tool plate TPL may be disposed in each of the first to fourth portions PP1 to PP4 of the head frame HF. For example, the tool plate TPL disposed in the first portion PP1 may extend in the first direction DR1. The tools TO may be disposed on the tool plate TPL.

A plurality of tool rails TR may be disposed on each of the first to fourth portions PP1 to PP4 of the head frame HF. For example, each of the tool rails TR disposed on the first portion PP1 may extend in the second direction DR2. The tool rails TR may be spaced apart from each other in the first direction DR1.

The tool plate TPL may move on the tool rails TR. For example, the tool plate TPL disposed on the first portion PP1 may move in the second direction DR2 along the tool rails TR. The tools TO may move together with the tool plate TPL. Similarly, the tools TO disposed on the second to fourth portions PP2 to PP4 may move in the first direction DR1 or the second direction DR2 as the tool plate TPL moves on the tool rails TR.

According to an embodiment, a distance between the tools TO adjacent to each other may be adjusted. For example, the distance in the first direction DR1 between the tools TO disposed on the first and second portions PP1 and PP2 may be varied. The distance in the second direction DR2 between the tools TO disposed on the bottom surface BF of the third and fourth portions PP3 and PP4 may be varied.

According to an embodiment, the transfer driver TD may move the head assembly HA in the first direction DR1, the second direction DR2, or the third direction DR3 (refer to FIG. 4). For example, the transfer driver TD may include a first guide bar GB1, a first connector CO1, and a second connector CO2.

The first guide bar GB1 may extend in the first direction DR1. A first end E1 and a second end E2 of the first guide bar GB1 may be respectively inserted into the first guide groove GH1 of the first sidewall SW1 and the first guide groove GH1 of the second sidewall SW2. The first guide bar GB1 may move in the second direction DR2.

The first connector CO1 may move in the first direction DR1. For example, the first connector CO1 may surround a portion of the first guide bar GB1. The first connector CO1 may move in the first direction DR1 on the first guide bar GB1.

The second connector CO2 may be disposed on a side surface of the first connector CO1. The second connector CO2 may move in the third direction DR3 on a side surface of the first connector CO1. For instance, a guide rail structure that extends in the third direction DR3 may be provided between the first connector CO1 and the second connector CO2. The head assembly HA may be connected to the second connector CO2.

According to an embodiment, the head assembly HA may move in the first direction DR1, the second direction DR2, and the third direction DR3 by the transfer driver TD.

In an embodiment, the mask manufacturing equipment MD may include one or a transfer module TM, however, it should not be limited thereto or thereby. For example, the mask manufacturing equipment MD may include a plurality of transfer modules to increase a production yield of the mask.

Figure 6:
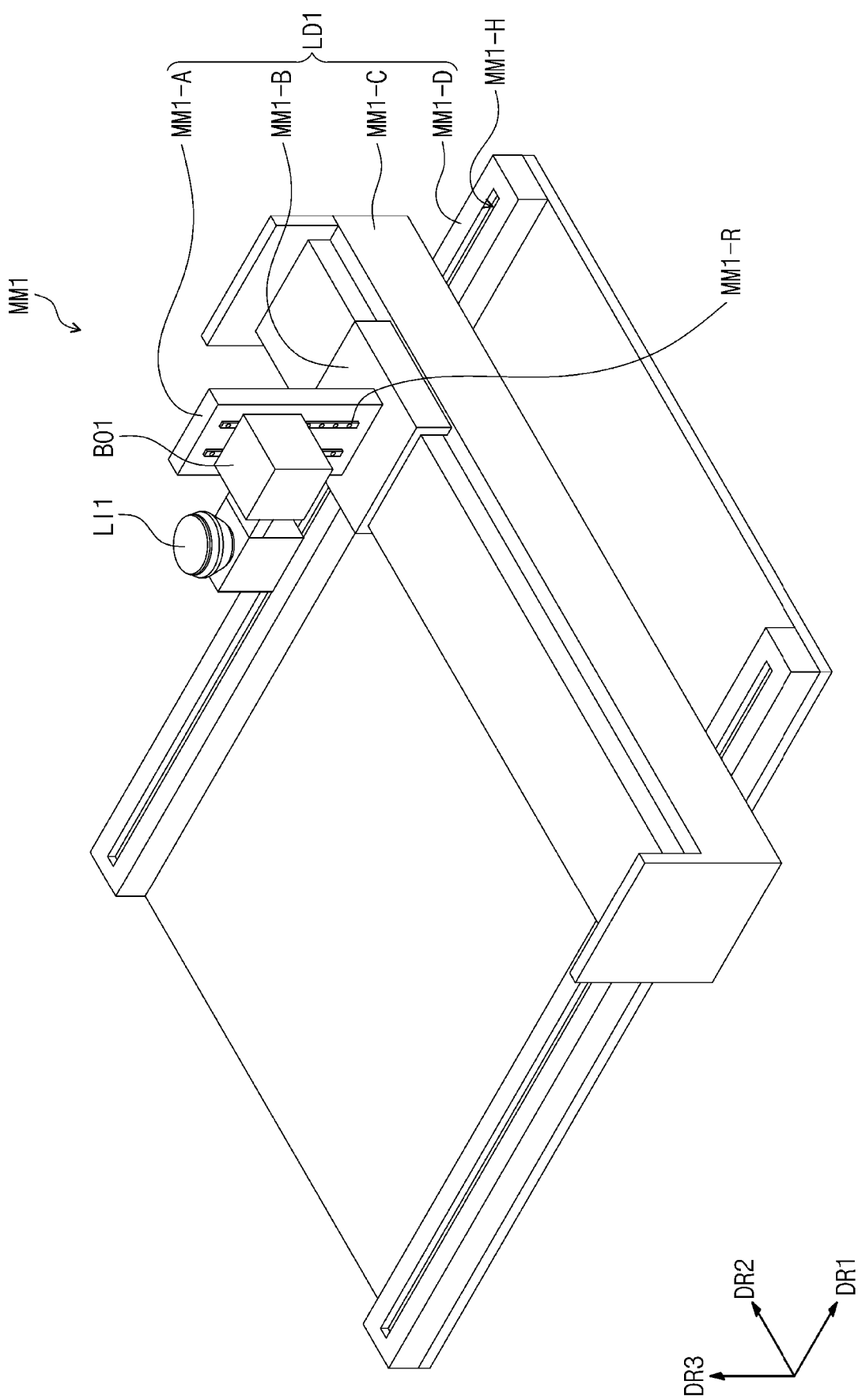
FIG. 6 is a perspective view showing a first processing module shown in FIG. 3.

FIG. 6 is a perspective view showing the first processing module MM1 shown in FIG. 3.

Referring to FIGS. 3 and 6, the first processing module MM1 may fix the cell mask CMK shown in FIG. 1 onto the mask frame MF. The first processing module MM1 may be disposed in the first opening OP1 of the first stage ST1.

According to an embodiment, the first processing module MM1 may include a first laser irradiator LI1, a first body BO1, and a first laser driver LD1. The first laser irradiator LI1 may generate a first laser beam. The first laser irradiator LI1 may irradiate the first laser beam in an upward direction. The first laser beam may heat an irradiation point. Objects around the irradiation point where the first laser beam irradiates may be melted.

The first laser irradiator LI1 may be mounted on the first body BO1. The first body BO1 may be connected to the first laser driver LD1. The first laser driver LD1 may move the first body BO1 in the first, second, and third directions DR1, DR2, and DR3.

For example, the first laser driver LD1 may include a first connection member MM1-A, a second connection member MM1-B, a first guide member MM1-C, and a second guide member MM1-D. The first body BO1 may be connected to a side surface of the first connection member MM1-A.

A guide rail MM1-R may be disposed between the first body BO1 and the first connection member MM1-A. The first body BO1 may move in the third direction DR3 by the guide rail MM1-R.

A lower portion of the first connection member MM1-A may be connected to the second connection member MM1-B. The second connection member MM1-B may be connected to the first guide member MM1-C to be movable. For example, the first guide member MM1-C may extend in the second direction DR2. The second connection member MM1-B may be connected or coupled to an upper portion of the first guide member MM1-C and may move in the second direction DR2.

The first guide member MM1-C may be mounted on the second guide member MM1-D to be movable. In an embodiment, two second guide members MM1-D may be provided. Each of the second guide members MM1-D may extend in the first direction DR1. The second guide members MM1-D may be spaced apart from each other in the second direction DR2.

A guide groove MM1-H may be formed or defined on an upper surface of the second guide member MM1-D. The first guide member MM1-C may be connected or coupled to the guide groove MM1-H and may move in the first direction DR1.

Consequently, the first laser irradiator LI1 may move in the first, second, and third directions DR1, DR2, and DR3 by the first laser driver LD1.

Figure 7:
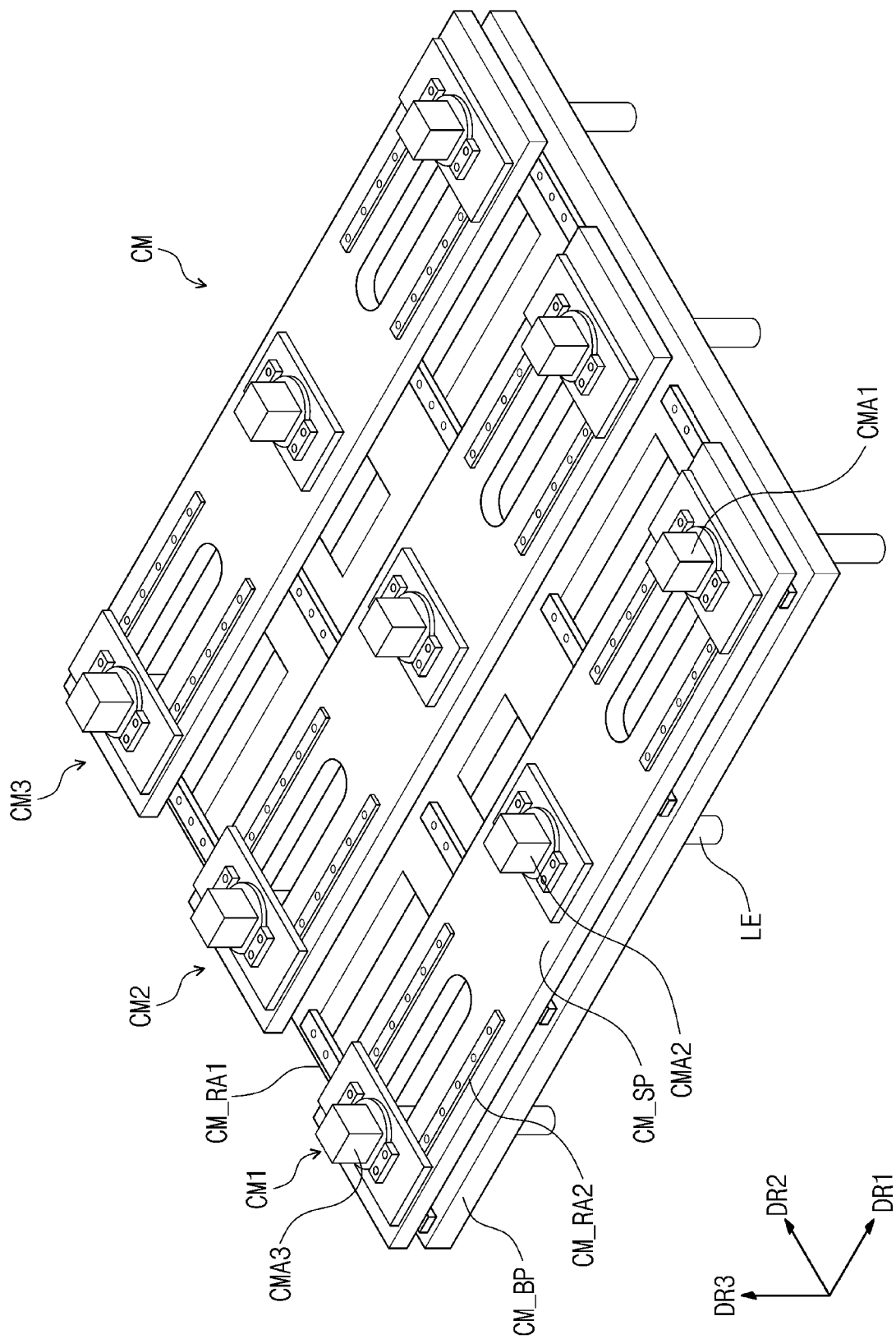
FIG. 7 is a perspective view showing a camera module shown in FIG. 3.

FIG. 7 is a perspective view showing the camera module CM shown in FIG. 3.

Referring to FIGS. 3 to 7, the camera module CM may be disposed on the first stage ST1. The camera module CM may photograph an object disposed on the first stage ST1. For example, the camera module CM may substantially simultaneously photograph several points of the cell mask CMK disposed on the mask frame MF shown in FIG. 1 using a plurality of cameras.

In detail, the camera module CM may include a base plate CM_BP, and first, second, and third camera modules CM1, CM2, and CM3 disposed on the base plate CM_BP.

The first to third camera modules CM1 to CM3 may be spaced apart from each other in the second direction DR2. The first camera module CM1 and the third camera module CM3 may move in the second direction DR2 by a first rail part CM-RA1 disposed on the base plate CM_BP. For example, each of the first camera module CM1 and the third camera module CM3 may move to be close to or far away from the second camera module CM2.

Each of the first to third camera modules CM1 to CM3 may include a sub-plate CM_SP and first, second, and third cameras CMA1, CMA2, and CMA3 disposed on the sub-plate CM_SP. The sub-plate CM_SP may have a substantially plate shape extending long in the first direction DR1. The first to third cameras CMA1 to CMA3 may be arranged or disposed to be spaced apart from each other in the first direction DR1.

A distance between the first to third cameras CMA1 to CMA3 may be varied. For example, the first and third cameras CMA1 and CMA3 may move in the first direction DR1 by a second rail part CM_RA2 disposed on the sub-plate CM_SP. For example, the first and third cameras CMA1 and CMA3 may move to be close to or far away from the second camera CMA2.

Consequently, the distance between the cameras of the camera module CM may be varied in the first direction DR1 or the second direction DR2.

Lenses LE of the first to third cameras CMA1 to CMA3 may be disposed under or below the base plate CM_BP after passing through holes formed or defined through the sub-plate CM_SP and the base plate CM_BP. In an embodiment, the lenses LE may include telecentric lenses. Accordingly, the camera module CM may photograph a clear image regardless of the distance between the camera and each point of the object. However, the lenses LE should not be limited thereto or thereby.

Figure 8:
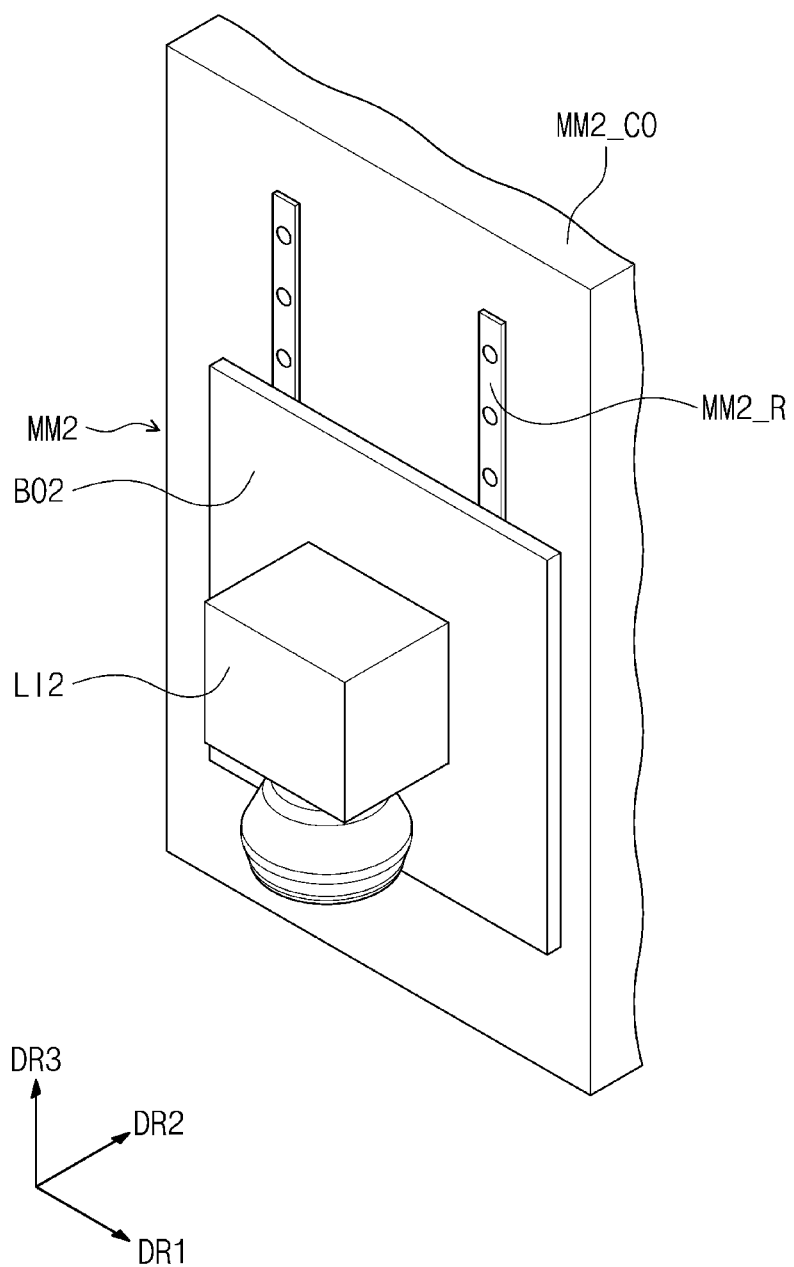
FIG. 8 is a perspective view showing a second processing module shown in FIG. 3.

FIG. 8 is a perspective view showing the second processing module MM2 shown in FIG. 3.

Referring to FIG. 8, the second processing module MM2 may process the cell mask CMK shown in FIG. 1. For example, the second processing module MM2 may cut an edge of the cell mask CMK.

According to an embodiment, the second processing module MM2 may include a second laser irradiator LI2 and a second body BO2.

The second laser irradiator LI2 may generate a second laser beam. The second laser irradiator LI2 may irradiate the second laser beam in a downward direction, for example, the third direction DR3. The second laser beam may cut an irradiation point thereof.

The second laser irradiator LI2 may be mounted on the second body BO2. The second body BO2 may be connected to a side surface of a second connection portion MM2_CO.

A rail member MM2_R may be disposed between the second connection portion MM2_CO and the second body BO2. The rail member MM2_R may extend in the third direction DR3. The second body BO2 may move in the third direction DR3 on the or a side surface of the second connection portion MM2_CO.

Referring to FIG. 3 again, the camera module CM and the second processing module MM2 may be connected to a second guide bar GB2. In detail, the second guide bar GB2 may include a horizontal portion GB2_H and a vertical portion GB2_V The horizontal portion GB2_H may extend in the first direction DR1. The vertical portion GB2_V may extend from opposite ends of the horizontal portion GB2_H in the downward direction, for example, the third direction DR3.

An end of the vertical portion GB2_V may be connected to the second guide groove GH2 formed or defined in the first and second sidewalls SW1 and SW2 to be movable. For example, the second guide bar GB2 may move in the second direction DR2 in which the second guide groove GH2 may extend.

The camera module CM may be connected to the second guide bar GB2 by a first connection portion CM_CO. In detail, the camera module CM may be connected to a side surface of the first connection portion CM_CO. The first connection portion CM_CO may be mounted on the horizontal portion GB2_H of the second guide bar GB2 to be movable. The first connection portion CM_CO may move in the first direction DR1 while being connected to the horizontal portion GB2_H.

The second processing module MM2 may be connected to the second guide bar GB2 by the second connection portion MM2_CO. In detail, the second processing module MM2 may be connected to the side surface of the second connection portion MM2_CO. The second connection portion MM2_CO may be connected to the horizontal portion GB2_H of the second guide bar GB2 to be movable. The second connection portion MM2_CO may move in the first direction DR1 while being connected to the horizontal portion GB2_H. The first connection portion CM_CO and the second connection portion MM2_CO may move independently of each other on the second guide bar GB2.

According to an embodiment, the second processing module MM2 and the camera module CM may move in the first direction DR1 or the second direction DR2. However, the movement of the second processing module MM2 and the camera module CM should not be limited thereto or thereby.

Figure 9:
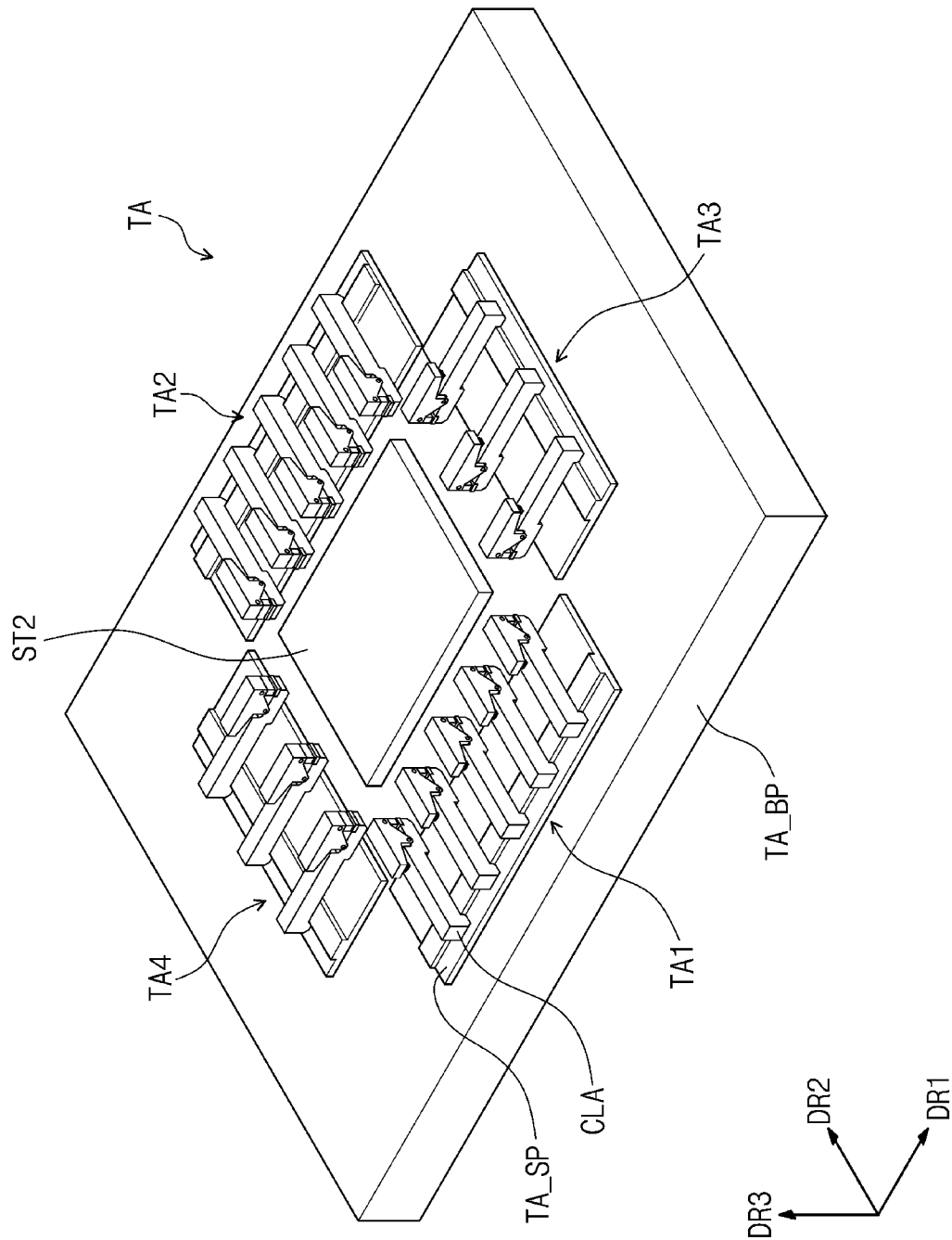
FIG. 9 is a perspective view showing a tension module shown in FIG. 3.

FIG. 9 is a perspective view showing a tension module TA shown in FIG. 3.

Referring to FIGS. 3 and 9, the mask manufacturing equipment MD according to an embodiment may include the tension module TA. The tension module TA may be disposed on the lower plate BP of the housing HO. The tension module TA may be spaced apart from the first stage ST1. The tension module TA may tension the cell mask CMK shown in FIG. 1 before the cell mask CMK is disposed on the mask frame MF.

According to an embodiment, the tension module TA may include a base plate TA_BP, a second stage ST2 disposed on the base plate TA_BP, and first, second, third, and fourth tension modules TA1, TA2, TA3, and TA4 disposed on the base plate TA_BP.

The base plate TA_BP may be disposed on the lower plate BP. When viewed in a plan view, the base plate TA_BP may have a substantially quadrangular shape. The second stage ST2 may be disposed at a center area of the base plate TA_BP.

When viewed in a plan view, the second stage ST2 may have a substantially quadrangular shape. The second stage ST2 may have an area smaller than an area of the cell mask CMK shown in FIG. 1. Accordingly, an edge area of the cell mask CMK may protrude from the second stage ST2 to the first direction DR1 and the second direction DR2.

The first to fourth tension modules TA1 to TA4 may be disposed around the second stage ST2. In more detail, the first to fourth tension modules TA1 to TA4 may be disposed to be adjacent to four sides of the second stage ST2, respectively.

Each of the first to fourth tension modules TA1 to TA4 may include a sub-plate TA_SP and a plurality of clamps CLA. For example, as shown in FIG. 9, each of the first tension module TA1 and the second tension module TA2 may include five clamps CLA. Each of the third tension module TA3 and the fourth tension module TA4 may include three clamps CLA. However, the number of the clamps CLA disposed on the first to fourth tension modules TA1 to TA4 should not be limited thereto or thereby.

The clamps CLA may be mounted on the sub-plate TA_SP to be movable. For example, each of the clamps CLA disposed on the first and second tension modules TA1 and TA2 may move in the second direction DR2. Each of the clamps CLA disposed on the third and fourth tension modules TA3 and TA4 may move in the first direction DR1. For example, the clamps CLA may move to be close to or far away from the second stage ST2.

According to an embodiment, a distance between the clamps CLA may be varied. For example, a distance in first direction DR1 between the clamps CLA disposed on the first and second tension modules TA1 and TA2 may be varied. A distance in second direction DR2 between the clamps CLA disposed on the third and fourth tension modules TA3 and TA4 may be varied.

According to an embodiment, as the tension module TA may include the plural tension modules TA1 to TA4, the tensioning process may be more precisely performed. This will be described in detail later.

According to an embodiment, the mask manufacturing equipment MD may include several modules to mount the cell mask CMK to the mask frame MF in a cell unit, and thus, the large-area mask may be easily manufactured.

Hereinafter, a method of manufacturing the mask MK shown in FIG. 1 using the mask manufacturing equipment MD according to an above-described embodiment will be described. For the convenience of explanation, the modules of the mask manufacturing equipment MD are schematically shown.

Figure 10:
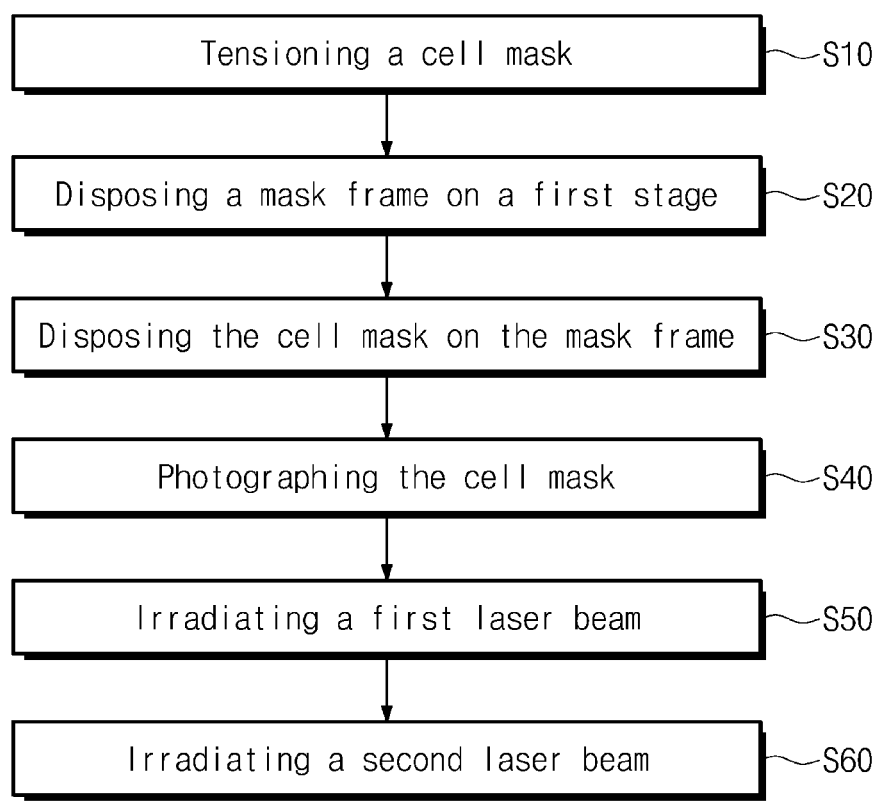
FIG. 10 is a flowchart showing a method of manufacturing a mask according to an embodiment.
Figure 11:
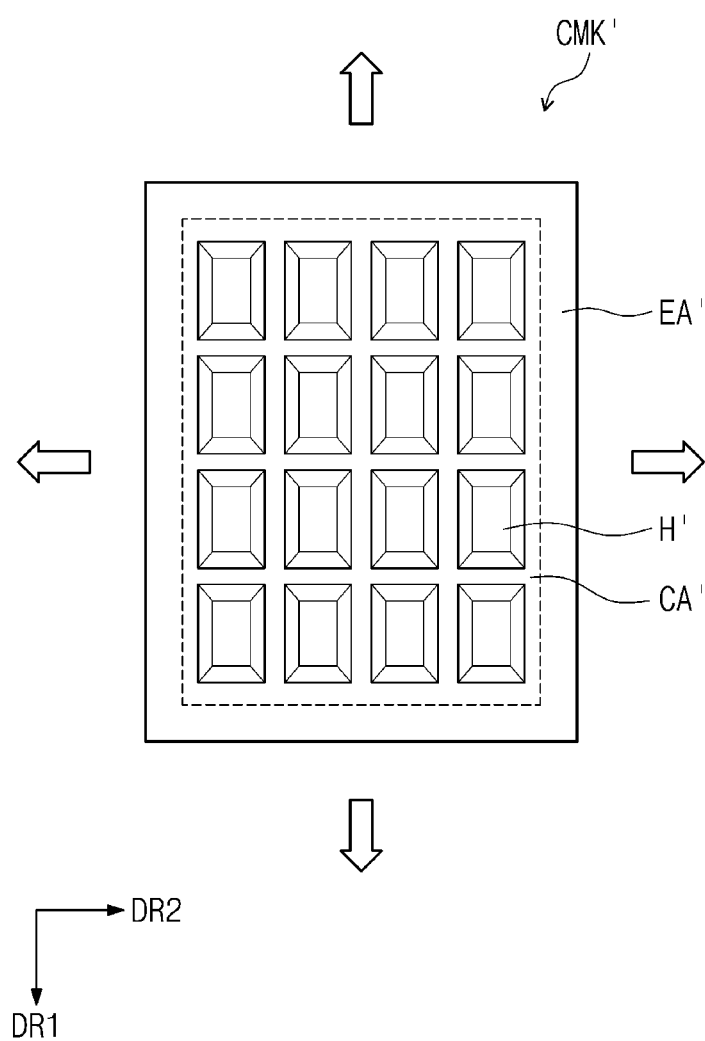
FIG. 11 a plan view showing a cell mask before a tensioning process.
Figure 12A:
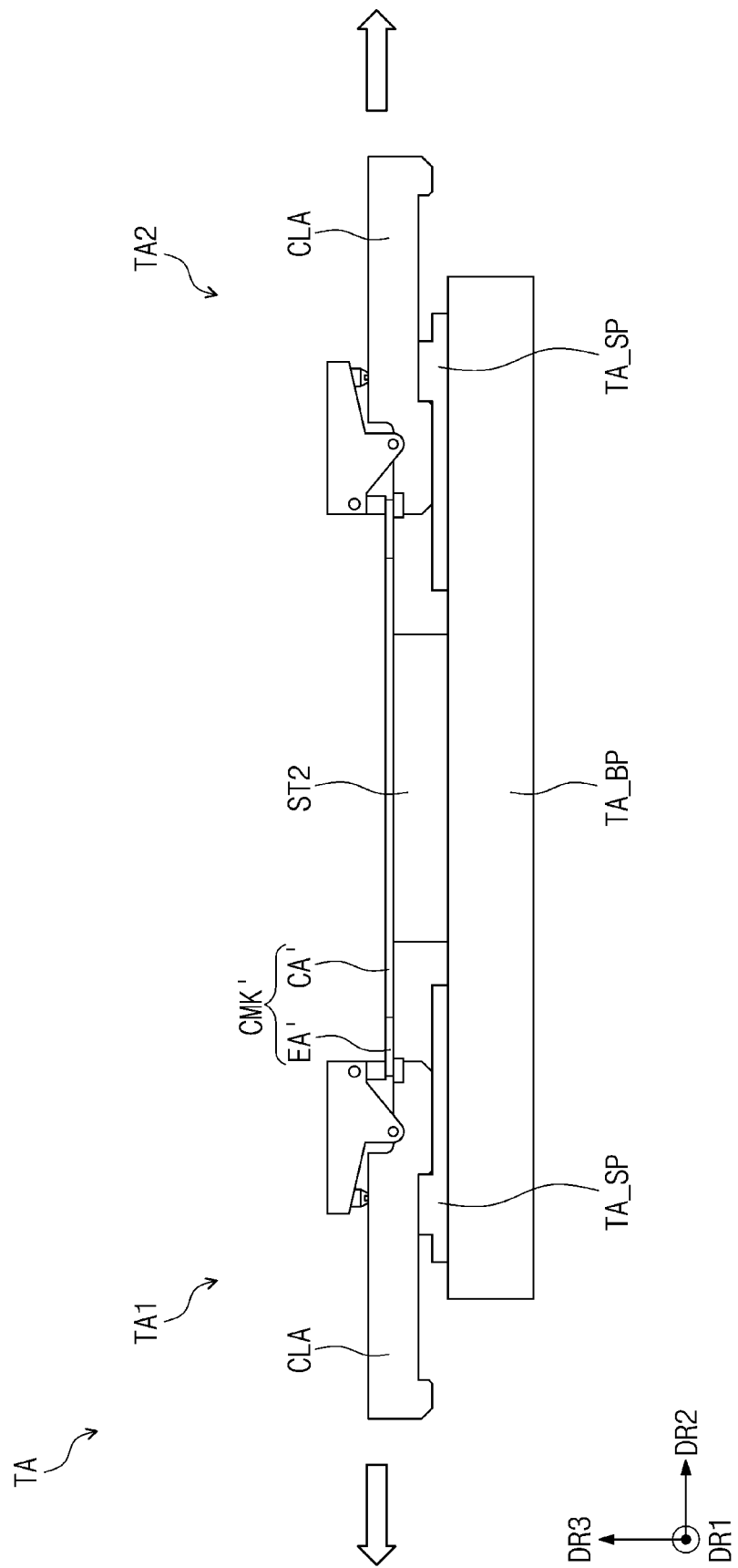
FIGS. 12A and 12B are views showing a process of tensioning the cell mask shown in FIG. 11.
Figure 12B:
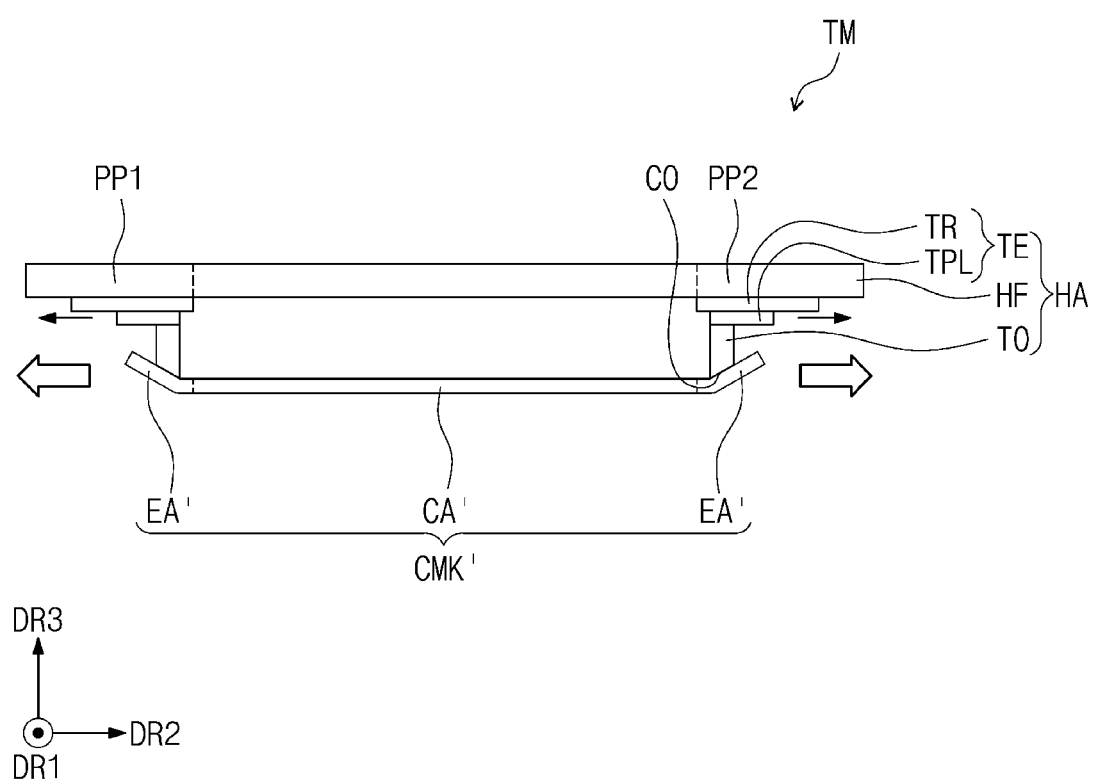
Figure 13:
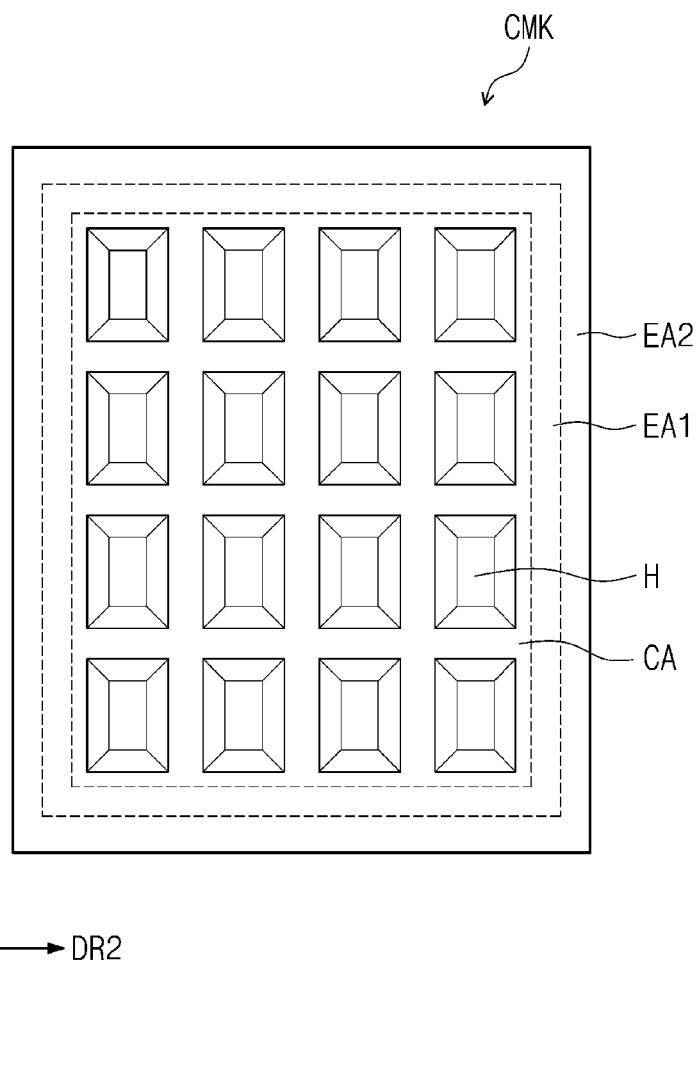
FIG. 13 is a plan view showing the cell mask after the tensioning process described in FIGS. 12A and 12B.

FIG. 10 is a flowchart showing the method of manufacturing the mask according to an embodiment. FIG. 11 a plan view showing a cell mask CMK' before a tensioning process. FIGS. 12A and 12B are views showing a process of tensioning the cell mask CMK' shown in FIG. 11. FIG. 13 is a plan view showing the cell mask CMK after the tensioning process described in FIGS. 12A and 12B.

Referring to FIGS. 10 and 11, the cell mask CMK' that is not tensioned may be tensioned (S10). The cell mask CMK' before being tensioned may include a center area CA' and an edge area EA'. A plurality of holes H' may be formed or defined in the center area CA'. The edge area EA' may extend in the first direction DR1 or the second direction DR2 from the center area CA'. The tensioning process (S10) may be performed by the tension module TA or the transfer module TM shown in FIG. 3.

Referring to FIG. 12A, the tension module TA may tension the cell mask CMK' disposed on the second stage ST2. In detail, the first tension module TA1 and the second tension module TA2 may tension the cell mask CMK' in the second direction DR2. The clamp CLA of the first tension module TA1 may hold one or an end of the cell mask CMK' in the edge area EA'. The clamp CLA of the second tension module TA2 may hold the other end of the cell mask CMK' in the edge area EA'. In this case, the other end may indicate an end opposite to the one or an end in the second direction DR2.

In FIG. 12A, the clamp CLA of the first tension module TA1 may move in a left side on sub-plate TA_SP, and the clamp CLA of the second tension module TA2 may move in a right side on sub-plate TA_SP. Accordingly, the cell mask CMK' disposed on the second stage ST2 may be tensioned in the second direction DR2. Although not shown in the figures, the third and fourth tension modules TA3 and TA4 may tension the cell mask CMK' in the first direction DR1 in the same manner as that of the first and second tension modules TA1 and TA2.

According to an embodiment, as the tension module TA may include the first to fourth tension modules TA1 to TA4 that may substantially simultaneously tension the four sides of the cell mask CMK', the tensioning process may be precisely performed.

Referring to FIG. 12B, the transfer module TM may tension the cell mask CMK'. In detail, the cell mask CMK' may be adsorbed to the transfer module TM using the tools TO. The tools TO may be in contact with an upper surface of the cell mask CMK' in the edge area EA'. The upper surface of the cell mask CMK' may be adsorbed to the contact surface CO of the tools TO. As described above, the cell mask CMK' may be adsorbed by the tools TO using one of the electromagnetic force, the electrostatic force, or the vacuum suction force.

The tool plate TPL on which the tools TO may be mounted may move outwardly on the tool rail TR. In FIG. 12B, the tool plate TPL disposed on the first portion PP1 may move to a left side, and the tool plate TPL disposed on the second portion PP2 may move to a right side. Accordingly, the cell mask CMK' may be tensioned in the second direction DR2. Although not shown in the figures, the tools TO and the tensioning driver TE, which may be disposed on the third and fourth portions PP3 and PP4 may tension the cell mask CMK' in the first direction DR1 in the same manner as that of the first and second portions PP1 and PP2.

According to the an embodiment, the process of tensioning the cell mask CMK' may be performed by the transfer module TM rather than the tension module TA. In this case, the transfer module TM may substantially simultaneously perform the process of tensioning the cell mask and the process of disposing the cell mask on the mask frame. Thus, a structure of the mask manufacturing equipment MD may be simplified, and a process efficiency may be improved.

According to an embodiment, a main tensioning process may be performed by the tension module TA, and a sub-tensioning process may be performed by the transfer module TM.

Referring to FIG. 13, the cell mask CMK' on which the tensioning process is performed may become the cell mask CMK. The cell mask CMK may include the center area CA through which the holes H may be formed or defined, the first edge area EA1 extending from the center area CA, and a second edge area EA2 extending from or adjacent to the first edge area EA1.

Each of the holes H may have a size greater than a size of the holes H' shown in FIG. 11. A sum of a size of the first edge area EA1 and a size of the second edge area EA2 may be greater than a size of the edge area EA' shown in FIG. 11. For example, the area of the cell mask CMK may increase in operation S10.

Figure 14:
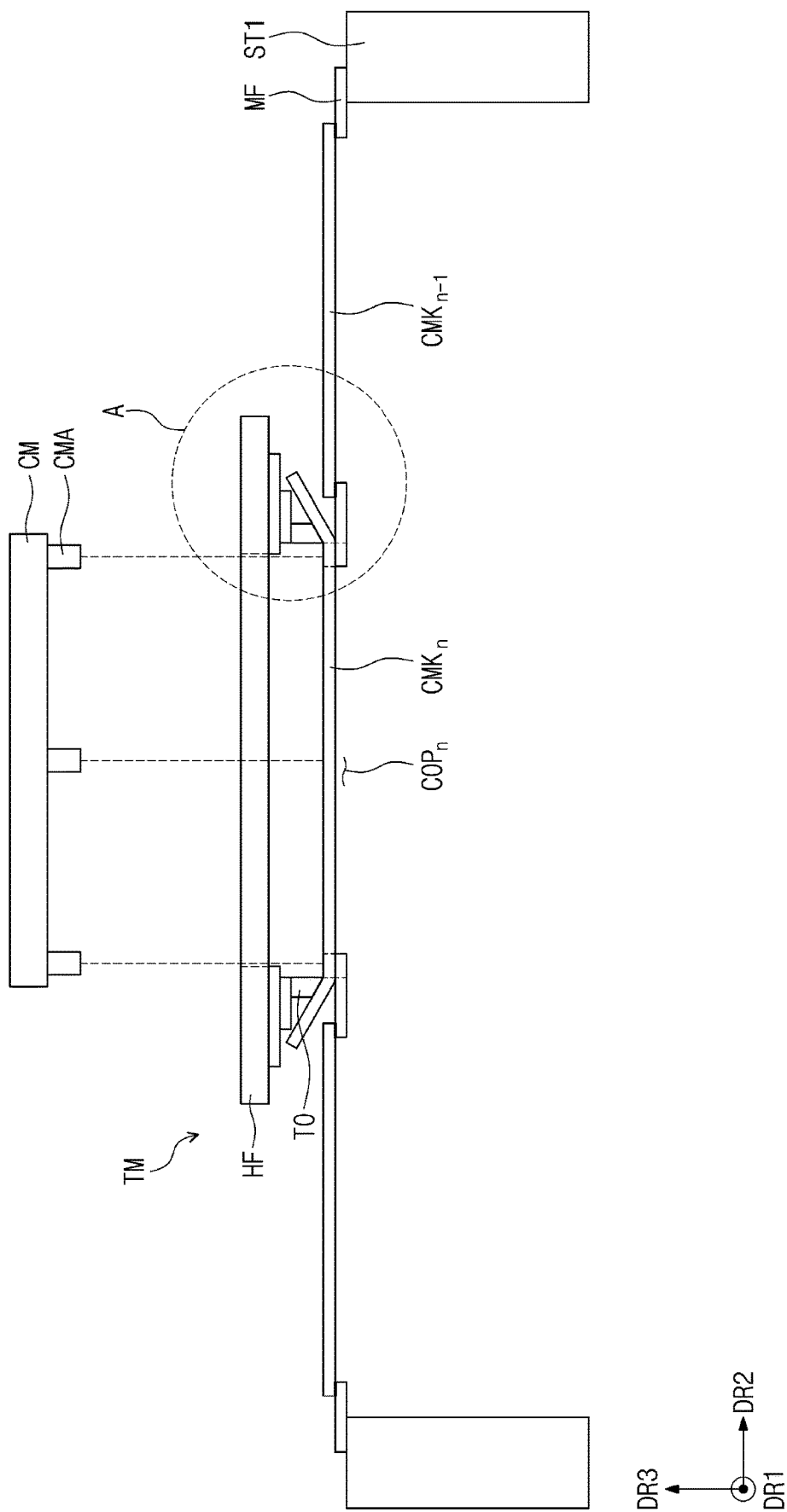
FIG. 14 is a view showing a mask frame disposed on a first stage and a cell mask disposed on the mask frame.
Figure 15:
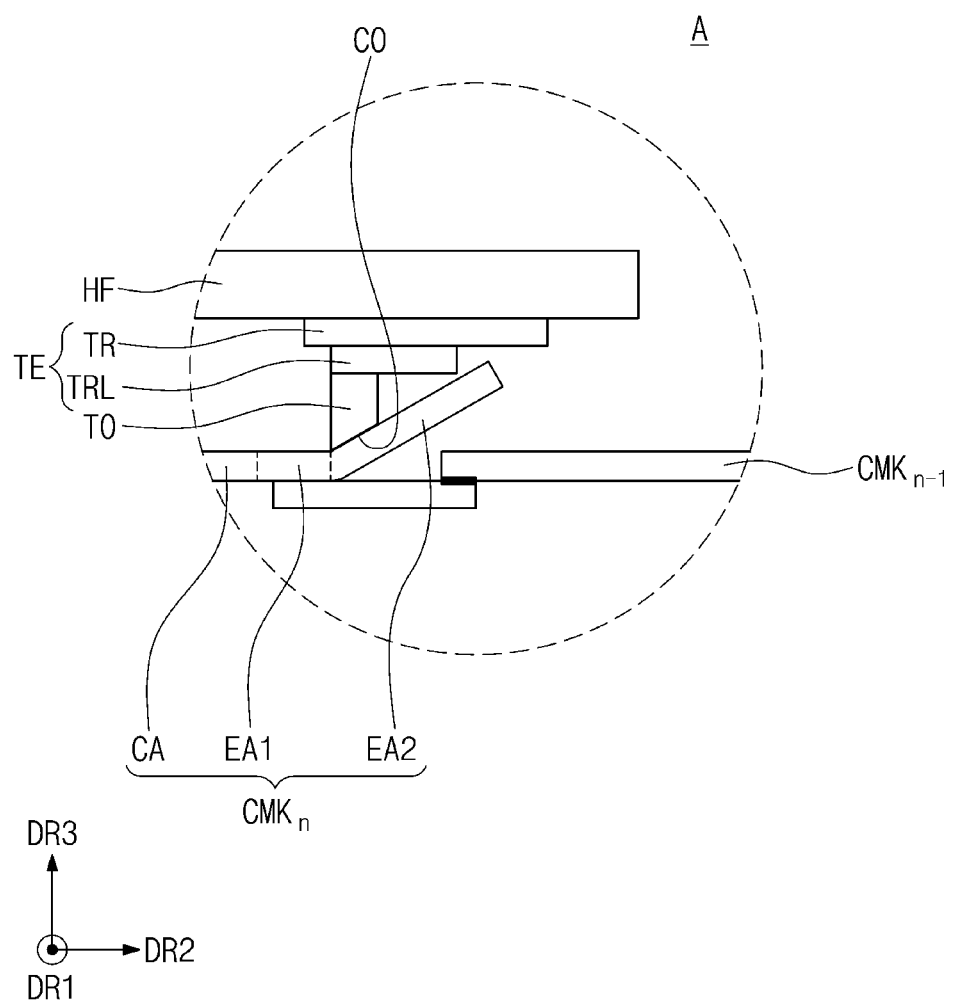
FIG. 15 is an enlarged view showing a portion A shown in FIG. 14.
Figure 16:
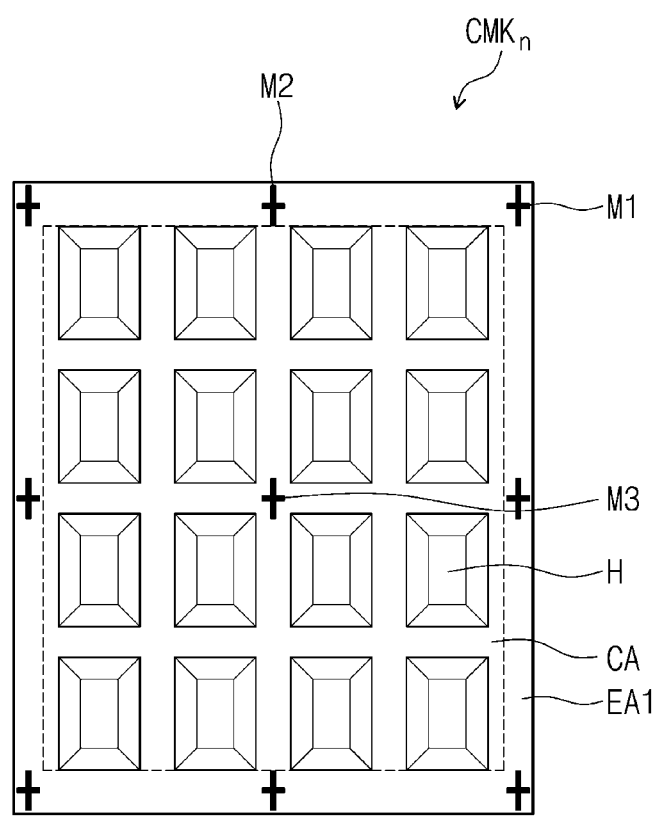
FIG. 16 is a plan view showing the cell mask as viewed from a camera module shown in FIG. 14.

FIG. 14 is a view showing the mask frame MF disposed on the first stage ST1 and a cell mask CMKn disposed on the mask frame MF. FIG. 15 is an enlarged view showing a portion A shown in FIG. 14. FIG. 16 is a plan view showing the cell mask CMKn as viewed from a camera module shown in FIG. 14.

For the convenience of explanation, the process of disposing the cell mask CMK on the mask frame MF is shown based on a state of being viewed in the first direction DR1 in the following drawings.

Referring to FIGS. 14 and 15, the mask frame MF may be disposed on the first stage ST1 (S20). The first stage ST1 may support the mask frame MF in the third direction DR3.

The cell mask CMK may be disposed on the mask frame MF (S30). In detail, the second edge area EA2 of the N-th cell mask CMKn may be adsorbed by the tools TO of the transfer module TM. In an embodiment, "N" is a natural number. The transfer module TM may have substantially the same structure as that of the transfer module TM shown in FIGS. 3 to 5.

The transfer module TM may move the N-th cell mask CMKn on the first stage ST1. The transfer module TM may dispose the N-th cell mask CMKn on an N-th cell opening COPn corresponding thereto. In this case, the first edge area EA1 of the N-th cell mask CMKn may be disposed on the border portion LP of the mask frame MF adjacent to the N-th cell opening COPn.

The contact surface CO of the tool TO of the transfer module TM may be the inclined surface. Accordingly, the second edge area EA2 of the N-th cell mask CMKn may be inclined at the predetermined angle with respect to the second direction DR2 or the first direction DR1. In detail, the height of the end of the second edge area EA2 may be higher than that of a point between the first edge area EA1 and the second edge area EA2.

Accordingly, the end of the second edge area EA2 and portions adjacent to the end of the second edge area EA2 of the N-th cell mask CMKn may be disposed at a position higher than that of a cell mask CMKn−1 adjacent to the N-th cell mask CMKn. Consequently, in a case that the N-th cell mask CMKn is disposed on the mask frame MF, an interference may not occur between the N-th cell mask CMKn and the adjacent cell mask CMKn−1.

Referring to FIGS. 13, 14, and 16, the camera module CM may photograph the N-th cell mask CMKn disposed on the mask frame MF (S40). The camera module CM may have substantially the same structure as that of the camera module CM shown in FIG. 7.

The cameras CMA of the camera module CM may photograph the N-th cell mask CMKn through the second opening OP2 (refer to FIG. 5) of the head frame HF. When viewed in a plan view, the size of the second opening OP2 may be substantially the same as the sum of the size of the center area CA and the size of the first edge area EA1 of the N-th cell mask CMKn. Accordingly, a range in which the camera module CM may photograph through the second opening OP2 may be limited to the center area CA and the first edge area EA1.

The cameras CMA of the camera module CM may photograph a plurality of marks M1, M2, and M3 defined in the N-th cell mask CMKn to determine in real time whether the marks M1, M2, and M3 are disposed at predetermined points. In detail, the cameras CMA may photograph four first marks M1 defined at corners of the first edge area EA1, four second marks M2 defined between the first marks M1, and a third mark M3 defined at a center of the center area CA.

According to an embodiment, as the camera module CM photographs the points of the N-th cell mask CMKn in real time, the N-th cell mask CMKn may be rapidly and precisely aligned.

Figure 17:
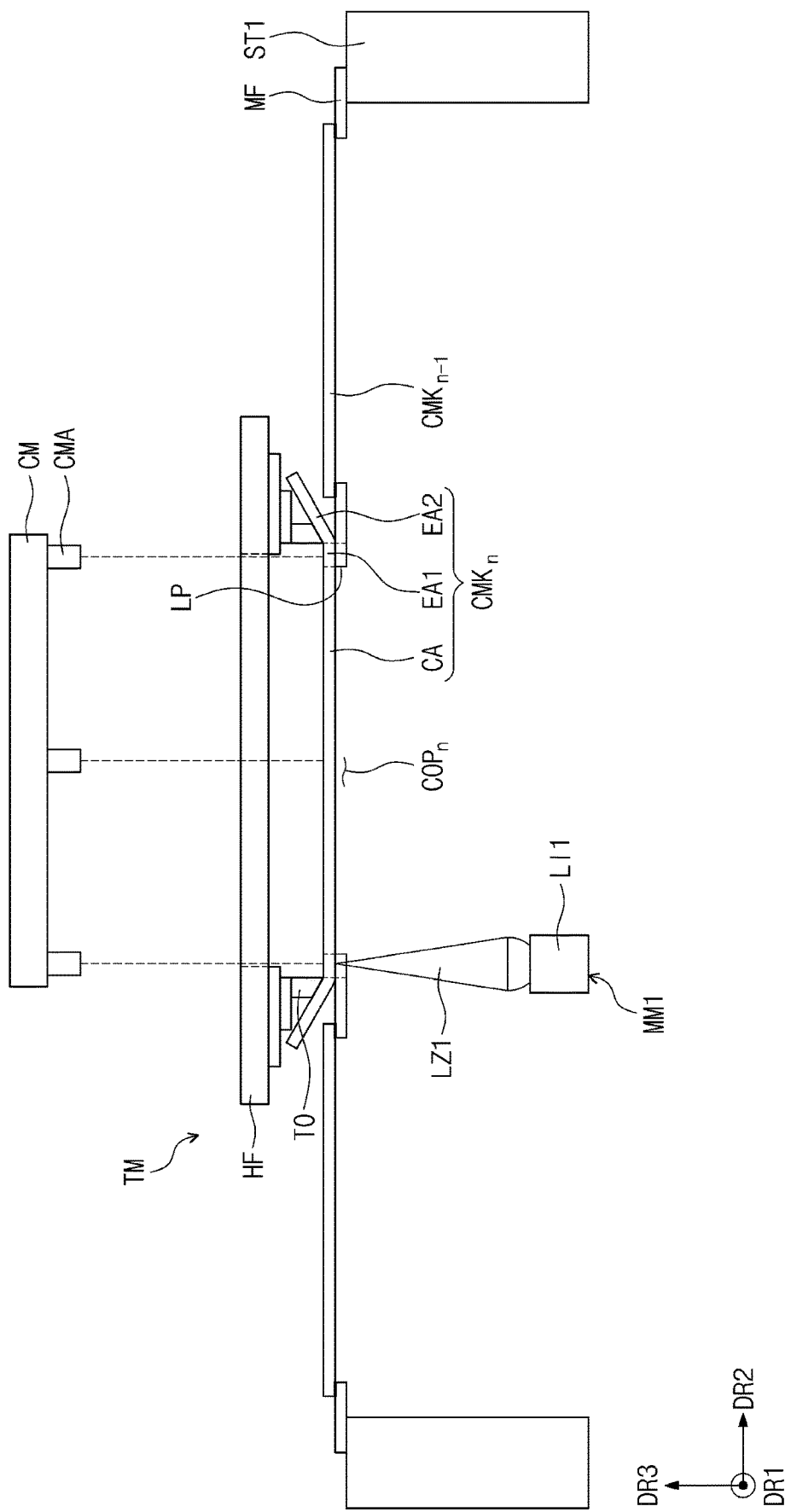
FIG. 17 is a view showing the cell mask fixed to the mask frame shown in FIG. 14.
Figure 18:
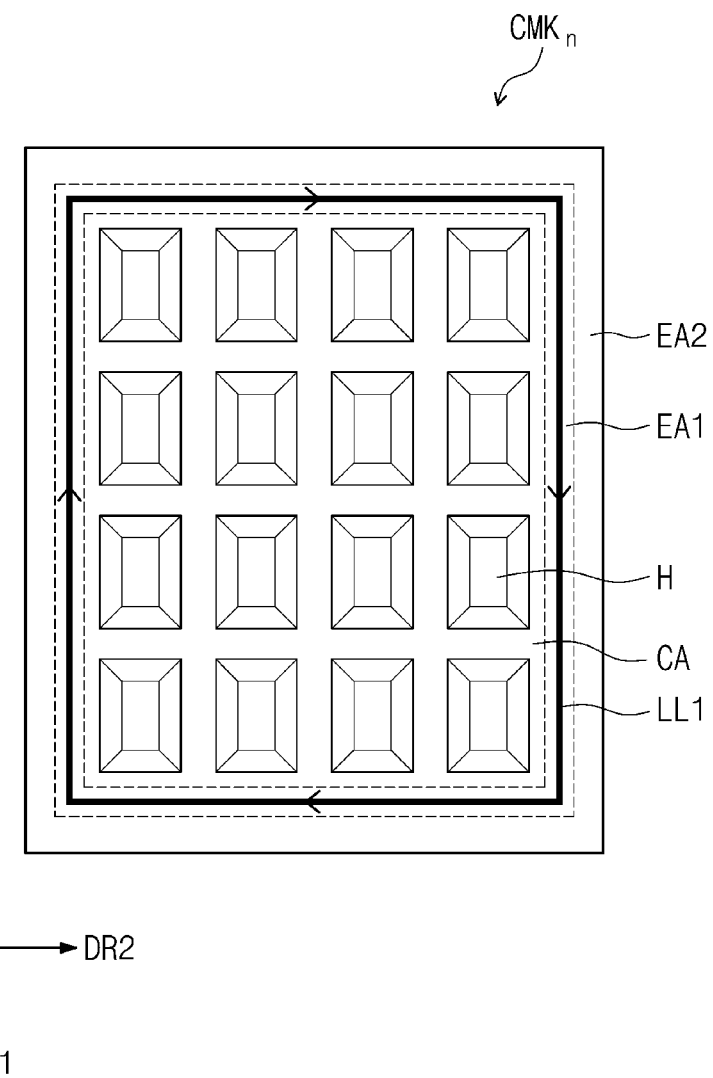
FIG. 18 is a plan view showing a first laser processing line defined in a cell mask.
Figure 19:
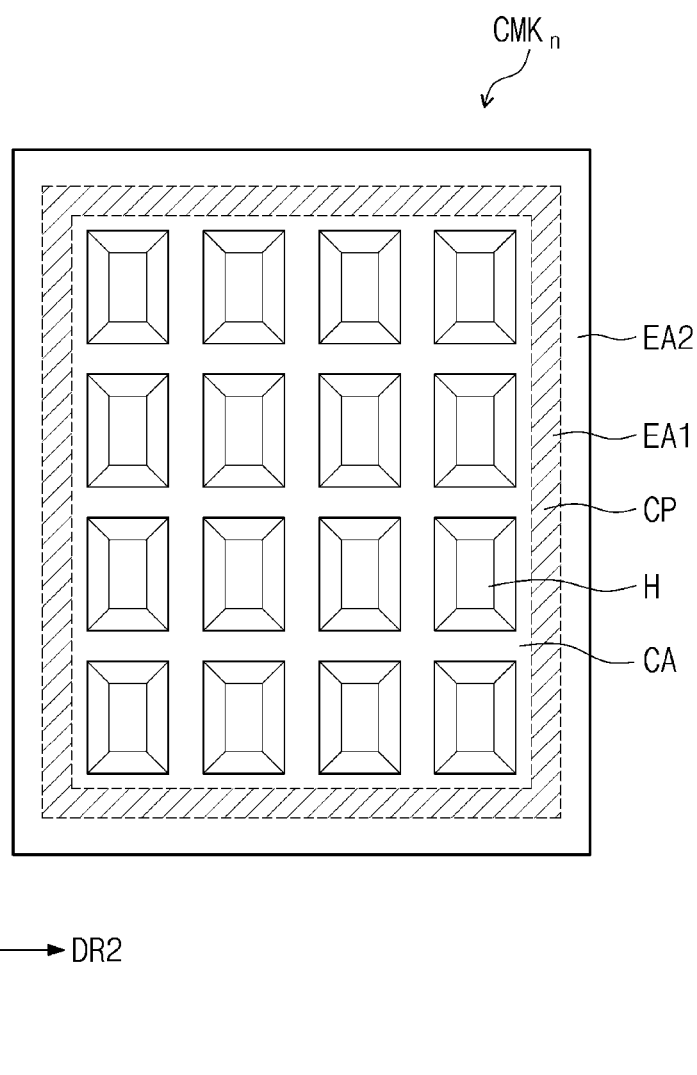
FIG. 19 is a plan view showing the cell mask after a first laser beam is irradiated along the first laser processing line shown in FIG. 18.

FIG. 17 is a view showing a process of fixing the cell mask CMKn shown in FIG. 14 to the mask frame. FIG. 18 is a plan view showing a first laser processing line LL1 defined in the cell mask CMKn. FIG. 19 is a plan view showing the cell mask CMKn after the first laser beam is irradiated along the first laser processing line LL1 shown in FIG. 18.

Referring to FIGS. 10 and 17 to 19, the first processing module MM1 may irradiate the first laser beam LZ1 (S50). The first processing module MM1 may have substantially the same structure as that of the first processing module MM1 shown in FIGS. 3 and 6.

The first laser beam LZ1 may be irradiated between the N-th cell mask CMKn and a portion of the mask frame MF, which may be in contact with the N-th cell mask CMKn. In more detail, the first processing module MM1 may irradiate the first laser beam LZ1 between the first edge area EA1 and the border portion LP that may be in contact with the first edge area EA1 of the N-th cell mask CMKn.

The first laser processing line LL1 may be defined in the first edge area EA1. The first laser processing line LL1 may be a substantially single closed curve. As described above, the first laser irradiator LI1 may move in the first, second, and third directions DR1, DR2, and DR3 by the first laser driver LD1. The first laser irradiator LI1 may irradiate the first laser beam LZ1 along the first laser processing line LL1. Substantially, the first laser beam LZ1 may be irradiated between the first edge area EA1 overlapping the first laser processing line LL1 and the border portion LP.

The first laser beam LZ1 may heat the irradiation point. A portion of the N-th cell mask CMKn in the first edge area EA1 adjacent to the irradiation point or the portion of the border portion LP may be melted. The melted the portion of the N-th cell mask CMKn in first edge area EA1 or the melted border portion LP may be cooled after the first laser beam LZ1 is irradiated along the first laser processing line LL1, and thus, a connection portion CP may be formed (refer to FIG. 19). Consequently, the N-th cell mask CMKn may be fixed to the mask frame MF by the first processing module MM1.

Figure 20:
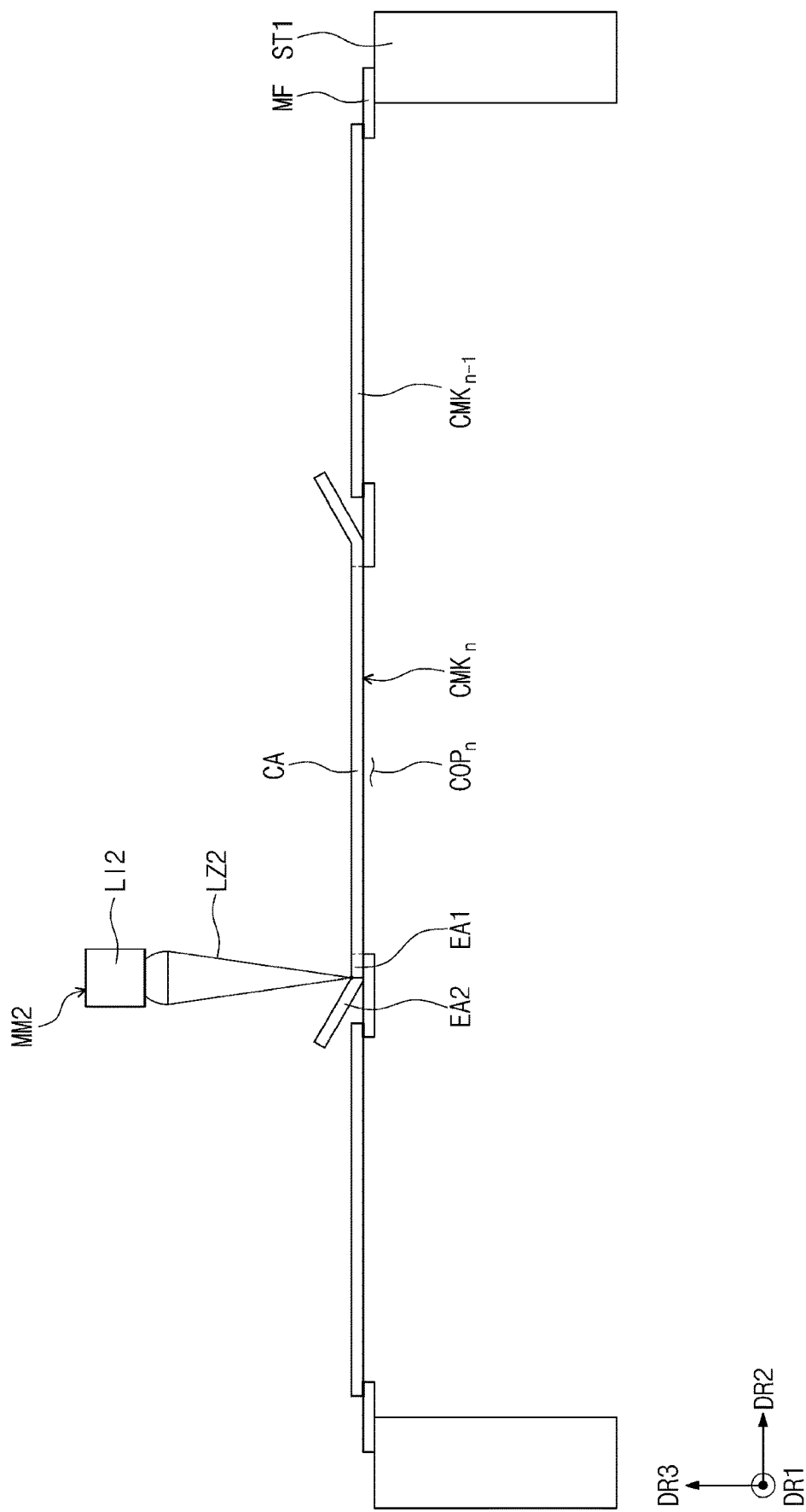
FIG. 20 is a view showing a process of processing a second edge area of the cell mask.
Figure 21:
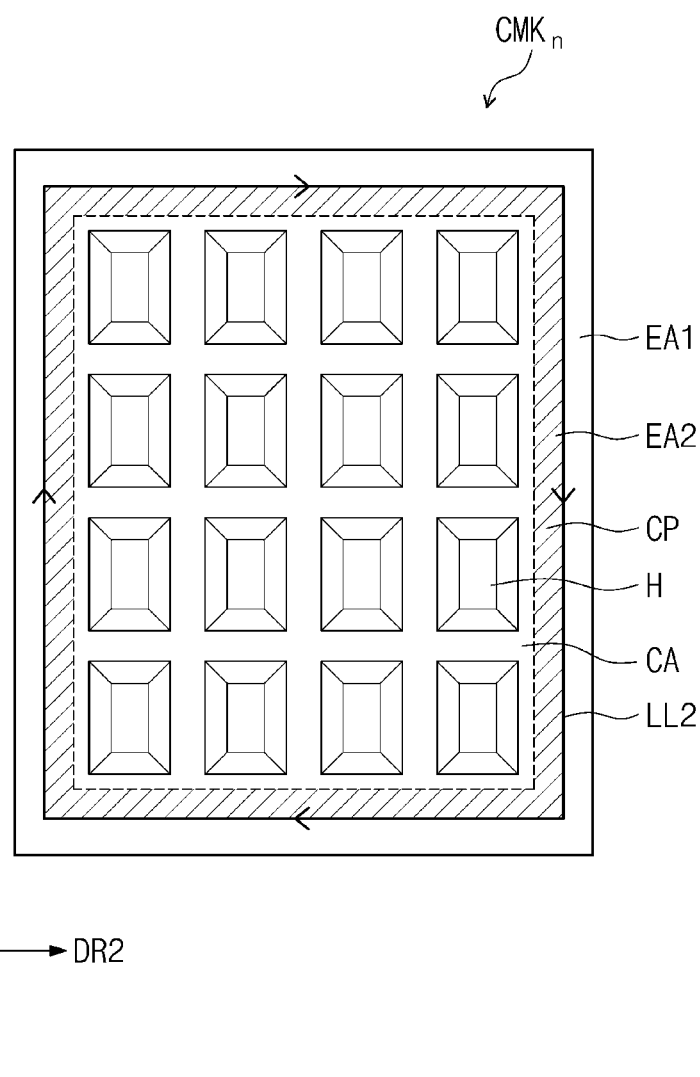
FIG. 21 is a plan view showing a second laser processing line defined in a cell mask.
Figure 22:
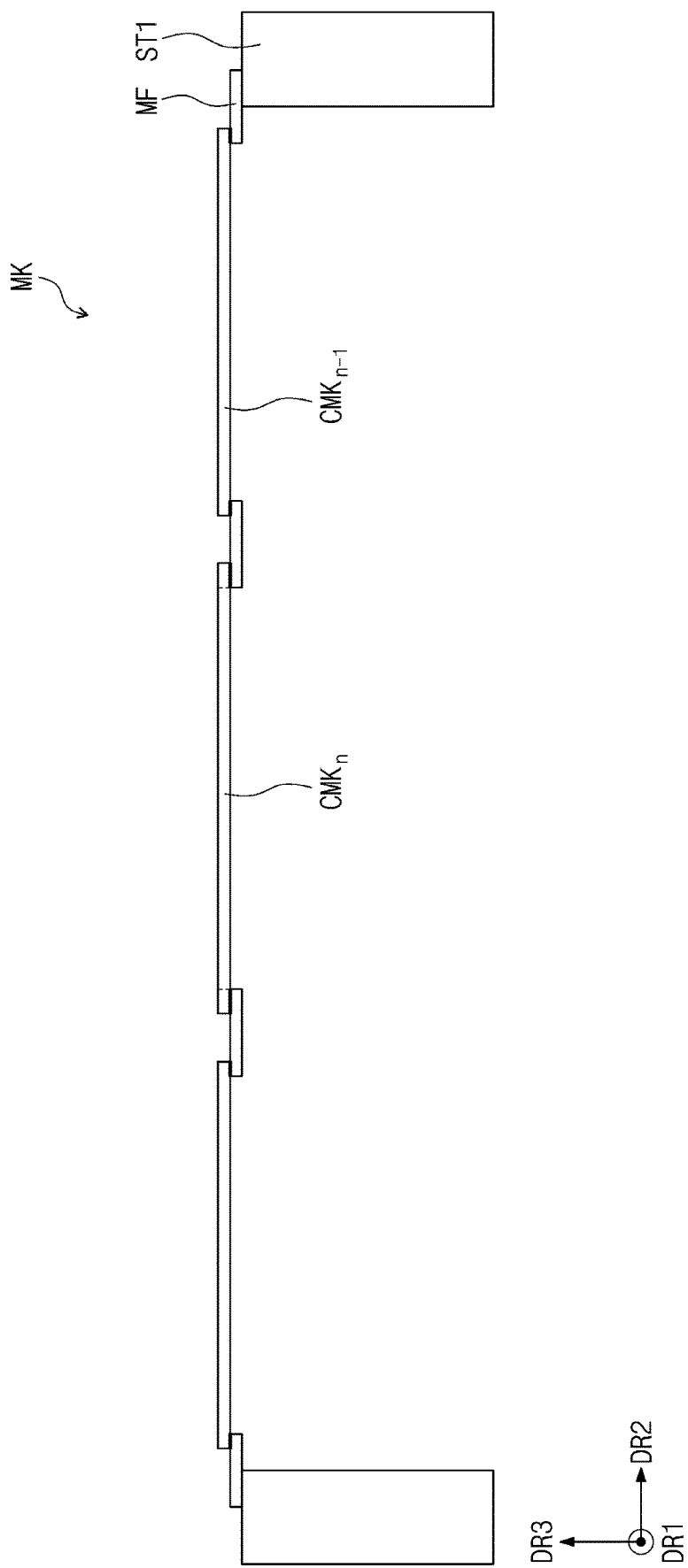
FIG. 22 is a view showing the cell mask after a second laser beam is irradiated along the second laser processing line shown in FIG. 21.

FIG. 20 is a view showing a process of processing the second edge area EA2 of the cell mask CMKn. FIG. 21 is a plan view showing a second laser processing line LL2 defined in the cell mask CMKn. FIG. 22 is a view showing the cell mask CMKn after the second laser beam LZ2 is irradiated along the second laser processing line LL2 shown in FIG. 21.

Referring to FIGS. 11 and 20 to 22, the second processing module MM2 may irradiate the second laser beam LZ2 (S60). The second processing module MM2 shown in FIG. 20 may have substantially the same structure as that of the second processing module MM2 shown in FIGS. 3 and 8.

The second edge area EA2 of the N-th cell mask CMKn may be cut by the second laser beam LZ2. In detail, the second laser processing line LL2 may be defined in the N-th cell mask CMKn. The second laser processing line LL2 may be a boundary line between the first edge area EA1 and the second edge area EA2. The second laser processing line LL2 may be a substantially single closed curve. The boundary line may also be referred to as a boundary area.

As described above, the second laser irradiator LI2 may move in the first direction DR1 or the second direction DR2. The second laser irradiator LI2 may irradiate the second laser beam LZ2 along the second laser processing line LL2. A portion of the second edge area EA2 adjacent to the irradiation point to which the second laser beam LZ2 may be irradiated may be cut. The second edge area EA2 may be separated from the N-th cell mask CMKn after the second laser beam LZ2 is irradiated along the second laser processing line LL2.

In a case that the above mask manufacturing processes S10 to S60 are repeatedly performed, the mask MK shown in FIGS. 1 and 22 may be manufactured.

Although embodiments of the disclosure have been described, it is understood that the disclosure should not be limited to these embodiments but various changes and modifications may be made by one of ordinary skill in the art within the spirit and scope of the disclosure as hereinafter claimed. For example, the mask manufacturing process may be performed while the processing modules, for example, the transfer module TM, the first processing module MM1, and the second processing module MM2, of the mask manufacturing equipment MD may be fixedly arranged or disposed and the first stage ST1 supporting the mask frame MF moves in one or a direction.

Therefore, embodiments are not limiting, but illustrative, and the spirit and scope of the disclosure is not limited thereto. The spirit and scope and the disclosure should be interpreted by the following claims, it should be interpreted that all technical ideas and scope which are equivalent to the disclosure are included within the spirit and scope of the disclosure.

What is claimed is:

1. A mask manufacturing equipment comprising:
    a first stage on which a mask frame is disposed, the mask frame including a plurality of cell openings arranged in a first direction and a second direction intersecting the first direction;
    a transfer module that places a plurality of cell masks on the mask frame to respectively overlap the plurality of cell openings of the mask frame and the plurality of cell masks;
    a camera module that photographs the plurality of cell masks;
    a first processing module that irradiates a first laser beam between a border portion corresponding to a portion of the mask frame adjacent to an N-th cell opening and a first edge area of an N-th cell mask disposed on the border portion when the first processing module is positioned under the N-th cell mask; and
    a second processing module that irradiates a second laser beam to a boundary area between the first edge area of the N-th cell mask and a second edge area of the N-th cell mask extending from the first edge area when the second processing module is positioned over the N-th cell mask, wherein N is a natural number,
    wherein the camera module is disposed over the N-th cell mask and the first processing module is disposed under the N-th cell mask, and the camera module and the first processing module are aligned to each other in a vertical direction when the first processing module irradiates the first laser beam and the camera module photographs the N-th cell mask,
    the second edge area of the N-th cell mask is bent toward the camera module,
    the camera module includes a plurality of camera modules,
    the plurality of camera modules comprise:
    a base plate having an upper surface and a lower surface opposite to each other;
    a plurality of sub-plates disposed on the upper surface of the base plate, and extending in the first direction, and spaced apart from each other in the second direction; and
    a plurality of cameras disposed on the plurality of sub-plates on the upper surface of the base plate,
    the plurality of sub-plates are movable along the base plate in the second direction,
    the plurality of cameras are movable along the plurality of sub-plates in the first direction, and
    a distance between the plurality of camera modules varies in the first and second directions by the plurality of sub-plates.

2. The mask manufacturing equipment of claim 1, wherein the transfer module comprises:
    a head assembly comprising a head frame and at least one tool disposed on a lower surface of the head frame; and
    a transfer driver transferring the head assembly in the first direction, the second direction, or a third direction substantially perpendicular to a plane defined by the first direction and the second direction.

3. The mask manufacturing equipment of claim 2, wherein
    the at least one tool includes a plurality of tools,
    the plurality of tools are spaced apart from each other and disposed around an opening of the head frame, and
    the plurality of tools include:
        a first group of tools spaced apart from each other and disposed along a first side of the opening of the head frame,
        a second group of tools spaced apart from each other and disposed along a second side of the opening of the head frame,
        a third group of tools spaced apart from each other and disposed along a third side of the opening of the head frame, and
        a fourth group of tools spaced apart from each other and disposed along a fourth side of the opening of the head frame.

4. The mask manufacturing equipment of claim 3, wherein
    the head assembly comprises a tensioning driver disposed between the head frame and the plurality of tools, and
    the tensioning driver moves the plurality of tools in a direction substantially parallel to an upper surface of the N-th cell mask and tensions the N-th cell mask when the plurality of tools adsorb the N-th cell mask.

5. The mask manufacturing equipment of claim 3, wherein
    the plurality of tools each include a lower surface, and
    each lower surface of the plurality of tools adsorbs an upper surface of the first edge area or the second edge area of the N-th cell mask.

6. The mask manufacturing equipment of claim 5, wherein the plurality of tools adsorb the plurality of cell masks using one of an electromagnetic force, an electrostatic force, and a vacuum suction power.

7. The mask manufacturing equipment of claim 5, wherein the plurality of tools comprise a contact surface inclined at an angle with respect to a plane defined by the first direction and the second direction.

8. The mask manufacturing equipment of claim 1, wherein the first processing module comprises:
   a first laser irradiator irradiating the first laser beam; and
   a first laser driver connected to the first laser irradiator to move the first laser irradiator in the first direction, the second direction, or a third direction substantially perpendicular to a plane defined by the first direction and the second direction.

9. The mask manufacturing equipment of claim 8, wherein the first processing module is disposed in an opening of the first stage.

10. The mask manufacturing equipment of claim 1, wherein the first laser beam melts a portion of the first edge area of the N-th cell mask and a portion of the border portion of the mask frame to fix the N-th cell mask to the mask frame.

11. The mask manufacturing equipment of claim 1, wherein
   the second processing module comprises a second laser irradiator that irradiates the second laser beam, and
   the second laser beam removes the second edge area from the N-th cell mask.

12. The mask manufacturing equipment of claim 1, wherein
   the plurality of camera modules further comprise:
      a plurality of lenses passing through the base plate and the plurality of sub-plates to protruding beyond the lower surface of the base plate,
   the plurality of cameras include:
      a first group of cameras that photograph first marks at corner portions of the N-th cell mask, and
      a second group of cameras that photograph second marks between the corner portions of the N-th cell mask.

13. The mask manufacturing equipment of claim 12, wherein each of the plurality of cameras comprises a telecentric lens.

14. The mask manufacturing equipment of claim 1, further comprising:
   a second stage on which the N-th cell mask is disposed; and
   a tension module comprising a plurality of clamps disposed around the second stage and tensioning the N-th cell mask in a direction substantially parallel to an upper surface of the N-th cell mask.

15. A mask manufacturing equipment comprising:
   a stage on which a mask frame is disposed, the mask frame including a cell opening;
   a transfer module that places a cell mask on the mask frame to overlap the cell opening and the cell mask;
   a plurality of camera modules that photographs the cell mask;
   a first processing module that irradiates a first laser beam between a border portion corresponding to a portion of the mask frame adjacent the cell opening and a first edge area of the cell mask disposed on the border portion when What the first processing module is positioned under the cell mask; and
   a second processing module that irradiates a second laser beam to a boundary area between the first edge area of the cell mask and a second edge area of the cell mask extending from the first edge area when the second processing module is positioned over the cell mask,
   wherein
   the first laser beam is irradiated between the border portion of the mask frame and the first edge area of the cell mask to form a connection portion extending in a closed shape along the border portion of the mask frame,
   the plurality of camera modules are positioned over the cell mask, the first processing module is positioned under the cell mask, and the plurality of camera modules and the first processing module are aligned to each other in a vertical direction, when the first processing module irradiates the first laser beam and the plurality of camera modules photographs the cell mask,
   the second edge area of the cell mask is bent toward the plurality of camera modules,
   the plurality of camera modules comprise:
      a base plate having an upper surface and a lower surface opposite to each other;
      a plurality of sub-plates disposed on the upper surface of the base plate, and extending in a first direction, and spaced apart from each other in a second direction intersecting the first direction, and
      a plurality of cameras disposed on the plurality of sub-plates on the upper surface of the base plate,
   the plurality of sub-plates are movable along the base plate in the second direction,
   the plurality of cameras are movable along the plurality of sub-plates in the first direction, and
   a distance between the plurality of camera modules varies in the first and second directions by the plurality of sub-plates.

* * * * *